(12) United States Patent
Kanegae

(10) Patent No.: US 8,895,989 B2
(45) Date of Patent: Nov. 25, 2014

(54) THIN-FILM SEMICONDUCTOR DEVICE FOR DISPLAY APPARATUS, METHOD FOR MANUFACTURING THIN-FILM SEMICONDUCTOR DEVICE FOR DISPLAY APPARATUS, EL DISPLAY PANEL, AND EL DISPLAY APPARATUS

(71) Applicant: Panasonic Corporation, Osaka (JP)

(72) Inventor: Arinobu Kanegae, Kyoto (JP)

(73) Assignee: Panasonic Corporation, Osaka (JP)

( * ) Notice: Subject to any disclaimer, the term of this patent is extended or adjusted under 35 U.S.C. 154(b) by 11 days.

(21) Appl. No.: 13/686,043

(22) Filed: Nov. 27, 2012

(65) Prior Publication Data

US 2013/0082271 A1    Apr. 4, 2013

Related U.S. Application Data

(63) Continuation of application No. PCT/JP2010/005845, filed on Sep. 29, 2010.

(51) Int. Cl.
 *H01L 33/36* (2010.01)
 *H01L 33/38* (2010.01)
 *H01L 27/12* (2006.01)

(52) U.S. Cl.
 CPC .............. *H01L 33/36* (2013.01); *H01L 33/387* (2013.01); *H01L 27/124* (2013.01)
 USPC  257/72; 257/91; 257/E33.053; 257/E33.062; 438/34

(58) Field of Classification Search
 CPC .... H01L 33/0041; H01L 33/36; H01L 33/387
 USPC ....................... 257/72, 91, E33.053, E33.061, 257/E33.062; 438/34
 See application file for complete search history.

(56) References Cited

U.S. PATENT DOCUMENTS

| 5,529,951 | A | 6/1996 | Noguchi et al. |
| 5,869,803 | A | 2/1999 | Noguchi et al. |
| 6,071,765 | A | 6/2000 | Noguchi et al. |
| 6,580,475 | B2 | 6/2003 | Yamazaki et al. |

(Continued)

FOREIGN PATENT DOCUMENTS

| JP | 7-235490 | 9/1995 |
| JP | 2000-221907 | 8/2000 |

(Continued)

OTHER PUBLICATIONS

International Search Report, mailed Dec. 14, 2010, for corresponding International Application No. PCT/JP2010/005845.

*Primary Examiner* — Allan R Wilson
(74) *Attorney, Agent, or Firm* — Greenblum & Bernstein, P.L.C.

(57) ABSTRACT

A thin-film semiconductor device for a display apparatus according to the present disclosure includes: a gate electrode above a substrate; a gate insulating film above the gate electrode; a semiconductor layer on the gate insulating film; a first electrode above the semiconductor layer; a second electrode in a same layer as the first electrode; an interlayer insulating film covering the first electrode and the second electrode; a gate line above the interlayer insulating film; and a power supply line in a same layer as the gate line and adjacent to the gate line. Furthermore, the gate electrode and the gate line are electrically connected via a first conductive portion, and the second electrode and the power supply line are electrically connected via a second conductive portion.

15 Claims, 25 Drawing Sheets

(56) References Cited

U.S. PATENT DOCUMENTS

| | | | |
|---|---|---|---|
| 6,781,153 B2* | 8/2004 | Anzai | 257/59 |
| 7,005,677 B2* | 2/2006 | Park et al. | 257/72 |
| 7,084,019 B2 | 8/2006 | Yamazaki et al. | |
| 7,456,430 B1 | 11/2008 | Yamazaki et al. | |
| 7,456,811 B2 | 11/2008 | Kwak | |
| 7,528,544 B2* | 5/2009 | Kwak et al. | 313/506 |
| 7,560,732 B2 | 7/2009 | Yamazaki et al. | |
| 7,781,770 B2 | 8/2010 | Yamazaki et al. | |
| 7,855,380 B2 | 12/2010 | Yamazaki et al. | |
| 7,858,974 B2* | 12/2010 | Yoon et al. | 257/40 |
| 7,915,613 B2* | 3/2011 | Park | 257/59 |
| 8,071,981 B2 | 12/2011 | Yamazaki et al. | |
| 8,129,721 B2 | 3/2012 | Yamazaki et al. | |
| 8,164,545 B2 | 4/2012 | Kwak | |
| 8,178,880 B2 | 5/2012 | Yamazaki et al. | |
| 8,274,207 B2* | 9/2012 | Kanegae | 313/498 |
| 8,482,010 B2* | 7/2013 | Kanegae | 257/72 |
| 2002/0044230 A1 | 4/2002 | Yamazaki et al. | |
| 2003/0197208 A1 | 10/2003 | Yamazaki et al. | |
| 2005/0023956 A1* | 2/2005 | Kwak et al. | 313/495 |
| 2005/0179374 A1 | 8/2005 | Kwak | |
| 2006/0249733 A1 | 11/2006 | Yamazaki et al. | |
| 2006/0261338 A1 | 11/2006 | Yamazaki et al. | |
| 2006/0273317 A1 | 12/2006 | Yamazaki et al. | |
| 2007/0114530 A1* | 5/2007 | Kimura | 257/59 |
| 2008/0272992 A1 | 11/2008 | Kwak | |
| 2009/0250704 A1 | 10/2009 | Yamazaki et al. | |
| 2010/0276696 A1 | 11/2010 | Yamazaki et al. | |
| 2011/0012119 A1 | 1/2011 | Yamazaki et al. | |
| 2011/0096278 A1* | 4/2011 | Kim et al. | 349/139 |
| 2012/0080685 A1 | 4/2012 | Yamazaki et al. | |
| 2012/0168763 A1 | 7/2012 | Yamazaki et al. | |
| 2013/0092920 A1* | 4/2013 | Kim et al. | 257/40 |

FOREIGN PATENT DOCUMENTS

| | | |
|---|---|---|
| JP | 2000-223279 | 8/2000 |
| JP | 2000-357799 | 12/2000 |
| JP | 2002-14628 | 1/2002 |
| JP | 2003-108033 | 4/2003 |
| JP | 2003-108068 | 4/2003 |
| JP | 2005-227788 | 8/2005 |
| JP | 2006-184384 | 7/2006 |
| JP | 2006-343504 | 12/2006 |
| JP | 2007-47808 | 2/2007 |
| JP | 2010-79043 | 4/2010 |

* cited by examiner

THIN-FILM SEMICONDUCTOR DEVICE FOR DISPLAY APPARATUS, METHOD FOR MANUFACTURING THIN-FILM SEMICONDUCTOR DEVICE FOR DISPLAY APPARATUS, EL DISPLAY PANEL, AND EL DISPLAY APPARATUS

CROSS REFERENCE TO RELATED APPLICATION

This is a continuation application of PCT Patent Application No. PCT/JP2010/005845 filed on Sep. 29, 2010, designating the United States of America. The entire disclosures of the above-identified application, including the specification, drawings and claims are incorporated herein by reference in their entirety.

TECHNICAL FIELD

One or more exemplary embodiments disclosed herein relate generally to thin-film semiconductor devices for display apparatuses, methods for manufacturing thin-film semiconductor devices for display apparatuses, electro-luminescence (EL) display panels, and EL display apparatuses, and particularly relates to a thin-film semiconductor device for display apparatus used for an active-matrix display apparatus, and a method for manufacturing the thin-film semiconductor device for display apparatus.

BACKGROUND ART

Thin-film transistors (TFT) are used as a switching device for selecting pixel or a driving device for display device in active-matrix drive display apparatuses such as liquid crystal display apparatuses and organic EL display apparatuses.

TFTs are used for active-matrix substrate in display apparatuses, and active research and development has been done for improving the capability. In particular, along with the increase in the size and increased definition of display apparatus, there is a demand for high driving capability TFT. In this context, semiconductor thin-films (polysilicon and microcrystalline silicon) crystallized for channel layers (active layers) have been attracting attention.

As a crystallizing process of a semiconductor thin film, instead of the conventional high temperature process technology in which a treatment temperature of 1000 degrees Celsius or higher is used, a low temperature process utilizing a treatment temperature of 600 degrees Celsius or lower has been developed. In the low temperature process, it is not necessary to use expensive substrate such as highly heat resistant quartz, which reduces manufacturing cost.

Laser annealing which uses laser beam for heating has attracted attention as a type of low temperature process. Laser annealing includes locally heating and melting, by irradiating laser beam, non-single crystal semiconductor thin film such as amorphous silicon laminated on an insulating substrate with low heat resistance such as glass, and crystallizing the semiconductor thin film during the cooling process. Mobility of carriers in the crystallized semiconductor thin film increases, improving capability of the thin-film transistor (for example, see Patent Literature 1).

Majority of suitable thin-film transistors have a bottom-gate structure in which gate electrodes are arranged in a level lower than the channel layer. The following describes a conventional bottom-gate thin-film transistor with reference to FIGS. 21, 22A to 22C, and 23. FIG. 21 is a plan view of the conventional thin-film semiconductor device corresponding to one pixel of the display apparatus. FIG. 22A is a cross-sectional view of the conventional thin-film semiconductor device for a display apparatus along the line X1-X1' in FIG. 21. FIG. 22B is a cross-sectional view of the conventional thin-film semiconductor device for a display apparatus along the line X2-X2' in FIG. 21. FIG. 22C is a cross-sectional view of the conventional thin-film semiconductor device for display apparatus along the line Y-Y' in FIG. 21. FIG. 23 is a perspective view corresponding to FIG. 22A, illustrating major components of the conventional thin-film semiconductor device for display apparatus from the cross section X1-X1' in FIG. 21.

As illustrated in FIGS. 21, 22A to 22C, and 23, the conventional thin-film semiconductor device 9 for display apparatus 9 includes a gate line 921 formed along the row direction of the pixel, a source line 922 formed along the column direction of the pixel, and a thin-film transistor 910 arranged at a position in which the gate line 921 and the source line 922 cross each other.

As illustrated in FIG. 22A, the thin-film transistor 910 is a bottom-gate thin-film transistor, and is a multilayer structure including a gate electrode 910G, a gate insulating film 930, a semiconductor layer (channel layer) 911, and one pair of source electrode 910S and a drain electrode 910D sequentially formed on a substrate 900.

As illustrated in FIGS. 21 and 22A, the gate electrode 910G extends from the gate line 921, and formed in a first metal layer ML1' in which the gate line 921 is also formed. The gate insulating film 930 is formed on the substrate 900 to cover the gate line 921 and the gate electrode 910G. The semiconductor layer 911 is formed on the gate insulating film 930 in an island shape overlapping the gate electrode 910G. One pair of the source electrode 910S and the drain electrode 910D is formed overlapping part of the semiconductor layer 911 and arranged separately opposite to each other. The source electrode 910S and the drain electrode 910D are formed in a second metal layer ML2', in which the source line 922 is also formed. Note that, an interlayer insulating film 940 is laminated covering the thin-film transistor 910, the gate line 921, and the source line 922.

Here, when forming the semiconductor layer 911 in the bottom-gate thin-film transistor 910 by forming amorphous silicon on the gate electrode 910G and crystallizing the amorphous silicon by laser annealing, the heat of laser annealing radiates through the gate electrode 910G when the amorphous silicon is melt. Accordingly, it is preferable that the gate electrode 910G is made of a material with small heat conductivity for suppressing the radiation of the heat at the time of laser annealing for crystallizing the semiconductor layer 911.

In the gate line 921, high line resistivity causes delay in signals or uneven display due to voltage drop. Particularly, increased driving frequency due to increased panel dimension makes the panel more likely to be affected by the line resistance. Therefore, it is preferable that the gate line 921 is composed of the material with low resistivity (specific resistance).

As described above, the gate electrode 910G and the gate line 921 are formed in the same layer. Thus, they are usually made of the same material. Thus, when the gate electrode 910G is made of the material with small heat conductivity in consideration of crystallizing the semiconductor layer 911, the gate line 921 is also made of the material with small heat conductivity. In contrast, when the gate line 921 is made of the material with small resistivity in consideration of the line resistance of the gate line 921, the gate electrode 910G is also made of the material with small resistivity.

However, most of metal with small heat conductivity has high resistivity. Thus, it is difficult to satisfy both the concern in crystallizing the semiconductor layer 911 and the concern in line resistance of the gate line 921 at the same time.

In order to address this problem, the thin-film semiconductor device for display apparatus which solves these concerns has been proposed (see Patent Literature 2). Patent Literature 2 discloses a structure in which the gate line is divided into two portions for satisfying both the heat conductivity of the gate electrode and reduced resistance in the gate line.

More specifically, in the thin-film semiconductor device for display apparatus according to Patent Literature 2, the gate line includes an integral portion integrally formed with the gate electrode and a separate portion connected to the integral portion through a contact hole. In addition, the integrated portion of the gate line three-dimensionally crosses the source line interposing the gate insulating film in between. The integrated portion of the gate electrode and the gate line are made of material with lower heat conductivity than the separate portion of the gate line, while the separate portion of the gate line is made of material with lower resistivity than the gate electrode.

CITATION LIST

Patent Literature

[Patent Literature 1] Japanese Unexamined Patent Application Publication No. H07-235490
[Patent Literature 2] Japanese Unexamined Patent Application Publication No. 2007-047808

SUMMARY

Technical Problem

One non-limiting and exemplary embodiment provides a thin-film semiconductor device for display apparatus, a method for manufacturing a thin-film semiconductor device for display apparatus, an EL display panel, and an EL display apparatus, which allow the gate electrode and the gate line to be made of a material suitable for each component, and reduces parasitic capacitance between the gate line and the power supply line.

Solution to Problem

In one general aspect, an aspect of the thin-film semiconductor device for display apparatus disclosed here feature a thin-film semiconductor device for a display apparatus, the thin-film semiconductor device including: a substrate; a gate electrode above the substrate; a gate insulating film above the substrate to cover the gate electrode; a semiconductor layer on the gate insulating film; a first electrode above the semiconductor layer; a second electrode in a same layer as the first electrode; an interlayer insulating film above the gate insulating film to cover the first electrode and the second electrode; a gate line above the interlayer insulating film in a layer different from a layer including the gate electrode; and a power supply line in a same layer as the gate line and adjacent to the gate line, in which the gate electrode and the gate line are electrically connected via a first conductive portion passing through the gate insulating film and the interlayer insulating film, and the power supply line and one of the first electrode and the second electrode are electrically connected via a second conductive portion passing through the interlayer insulating film.

Additional benefits and advantages of the disclosed embodiments will be apparent from the Specification and Drawings.

The benefits and/or advantages may be individually obtained by the various embodiments and features of the Specification and Drawings, which need not all be provided in order to obtain one or more of such benefits and/or advantages.

Advantageous Effects

According to the thin-film semiconductor device for display apparatus of the present disclosure, the gate line and the gate electrode are formed in different layers. Thus, it is possible to select different materials suitable for the gate line and the gate electrode.

Furthermore, since the gate line and the power supply line do not cross each other, parasitic capacitance in a region in which the gate line and the power supply line cross each other (overlapping region) can be eliminated.

Furthermore, since the power supply line is formed in the same layer as the gate line and arranged side-by-side with the gate line, it is possible to increase the flatness of the thin-film semiconductor device for display apparatus.

In addition, since a large area for a region in which the thin-film transistors are disposed is secured, it is possible to improve the flexibility in designing the layout of the thin-film transistors in the pixels. Furthermore, it is possible to secure a large are for the semiconductor layer. Accordingly, even when the mobility of the carriers in the thin-film transistors is low, it is possible to increase the width of the transistors.

BRIEF DESCRIPTION OF DRAWINGS

These and other advantages and features will become apparent from the following description thereof taken in conjunction with the accompanying Drawings, by way of non-limiting examples of embodiments of the present disclosure.

DESCRIPTION OF EMBODIMENT(S)

Figure 1:
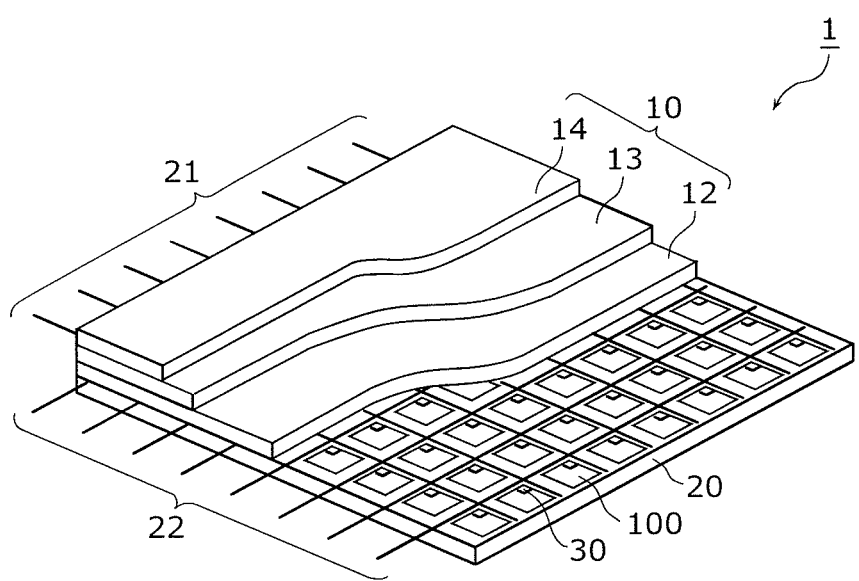
FIG. 1 is a partial cutout perspective view of an organic EL display panel according to the first embodiment.

An aspect of the thin-film semiconductor device for display apparatus according to the present disclosure includes a substrate; a gate electrode above the substrate; a gate insulating film above the substrate to cover the gate electrode; a semiconductor layer on the gate insulating film; a first electrode above the semiconductor layer; a second electrode in a same layer as the first electrode; an interlayer insulating film above the gate insulating film to cover the first electrode and the second electrode; a gate line above the interlayer insulating film in a layer different from a layer including the gate electrode; and a power supply line in a same layer as the gate line and adjacent to the gate line, in which the gate electrode and the gate line are electrically connected via a first conductive portion passing through the gate insulating film and the interlayer insulating film, and the power supply line and one of the first electrode and the second electrode are electrically connected via a second conductive portion passing through the interlayer insulating film.

According to this aspect, the gate line is arranged on the interlayer insulating film which is in a layer different from the layer in which the gate electrode is formed. Thus, it is possible to select different materials suitable for the gate line and the gate electrode.

Since the gate line and the power supply line are disposed side-by-side with each other in the same layer on the interlayer insulating film, the gate line and the power supply line do not cross each other. Accordingly, it is possible to eliminate parasitic capacitance generated in the region in which the gate line and the power supply line crosses each other (the overlapping region).

Furthermore, the power supply line is formed in the same layer as the gate line and is arranged side-by-side with the gate line, thereby reducing the unevenness on the interlayer insulating film due to only one of the gate line and the power supply line formed thereon, using the other of the gate line and the power supply line. With this, it is possible to improve the flatness of the thin-film semiconductor device for display apparatus.

Furthermore, since the power supply line is formed on the interlayer insulating film, it is not necessary to separately form the power supply line between the substrate and the interlayer insulating film. Accordingly, it is possible to secure a large area as an area in which the thin-film transistors are disposed. With this, it is possible to further improve the flexibility in the layout of the thin-film transistor for one pixel. In addition, it is possible to increase the area for the semiconductor layer in the thin-film transistor. Accordingly, even if the semiconductor layer is composed of a material having a low mobility of carriers, it is possible to increase the mobility of carriers by increasing the width of the transistor.

Furthermore, since the power supply line is arranged side-by-side with the gate line, the power supply line can supply power to the pixels arranged in the direction of the gate lines. For example, when the thin-film semiconductor device for display apparatus according to this aspect is used for the color display panel, power can be supplied from a common power supply line to pixels in red, green, blue arranged in the direction of the gate lines. With this, since it is not necessary to provide a power supply line separately for each of the pixels in red, green, and blue, a space for providing the power supply line can be reduced.

In an aspect of the thin-film semiconductor device for display apparatus according to the present disclosure, a width of the power supply line corresponds to a width of a gap between two adjacent gate lines, for example.

According to this aspect, it is possible to further increase the flatness of the thin-film semiconductor device for display apparatus. More specifically, when the gate line is formed on the interlayer insulating film, the gate lines protrudes from a region in which the gate line is not formed as much as the thickness of the gate line without any adjustment. In contrast, according to this aspect, the width of the power supply line corresponds to the width of the gap between the two adjacent gate lines. Therefore, the power supply line can be used as structure for planarization. Thus, it is possible to secure the flatness of the thin-film semiconductor device for display apparatus with a simple structure.

In an aspect of the thin-film semiconductor device for display apparatus according to the present disclosure, a distance from the power supply line to the two adjacent gate lines is greater than or equal to 4 μm, for example.

According to this aspect, it is possible to arrange the power supply line and the gate line without affecting each other. Furthermore, it is possible to increase the flatness of the thin-film semiconductor device for display apparatus.

In an aspect of the thin-film semiconductor device for display apparatus according to the present disclosure, the power supply line is arranged near the two adjacent gate lines to fill the gap between the two adjacent gate lines, for example.

According to this aspect, it is possible to further increase the flatness of the thin-film semiconductor device for display apparatus.

In an aspect of the thin-film semiconductor device for display apparatus according to the present disclosure, the power supply line has a uniform thickness, and formed along a shape of a surface under the power supply line, for example.

According to this aspect, the power supply line is substantially tabular in plan view. With this, the power supply line can be a tabular line with a wide width. Thus, it is possible to reduce the line resistance in the power supply line. Thus, the power is supplied from the power supply line with low line resistance to the first electrode or the second electrode. Thus, with respect to the IR drop generated along the increase in screen size of the display apparatus in the central region of the display area, it is possible to significantly reduce the IR drop amount.

In an aspect of the thin-film semiconductor device for display apparatus according to the present disclosure, the semiconductor layer is an N-channel semiconductor layer, and at least part of the power supply line is arranged not to overlap the semiconductor layer, for example.

According to this aspect, the N-channel semiconductor layer is formed not to overlap the power supply line, thereby suppressing the induced carriers in the back channel. With this, it is possible to suppress the generation of off-leakage current. Thus, it is possible to implement thin-film semiconductor device for display apparatus with a thin-film transistor with good off-characteristics.

In an aspect of the thin-film semiconductor device for display apparatus according to the present disclosure, the semiconductor layer is a P-channel semiconductor layer, and at least part of the power supply line is arranged to overlap the semiconductor layer, for example.

According to this aspect, the P-channel semiconductor layer is formed to overlap the power supply line, thereby stabilizing electric potential at the back channel. With this, it is possible to suppress the generation of off-leakage current. Thus, it is possible to implement a thin-film semiconductor device for display apparatus with a thin-film transistor with good off-characteristics.

In an aspect of the thin-film semiconductor device for display apparatus according to the present disclosure, the first electrode is a source electrode, and the second electrode is a drain electrode, for example. Furthermore, in an aspect of the thin-film semiconductor device for display apparatus according to the present disclosure, the first electrode is a drain electrode, and the second electrode is a source electrode, for example.

In an aspect of the thin-film semiconductor device for display apparatus according to the present disclosure, the semiconductor layer includes a polycrystalline semiconductor layer, for example.

According to this aspect, the polycrystalline semiconductor layer further increases mobility of the carriers, and thus, it is possible to implement a thin-film semiconductor device for display apparatus including a thin-film transistor with good ON-characteristics.

In an aspect of the thin-film semiconductor device for display apparatus according to the present disclosure, the power supply line includes one element selected from among Al, Cu, and Ag, for example. In an aspect of the thin-film semiconductor device for display apparatus according to the present disclosure, the power supply line is a multilayered line, for example.

According to this aspect, it is possible to form the power supply line using metal material with low resistivity among materials for lines, thereby further reducing the electrical resistance of the power supply line.

In an aspect of the method for manufacturing the thin-film semiconductor device for display apparatus according to the present disclosure, preparing a substrate; forming a gate electrode by depositing a first metal film above the substrate and by patterning the first metal film; forming a gate insulating film above the substrate to cover the gate electrode; forming a semiconductor layer on the gate insulating film; forming a first electrode and a second electrode above the semiconductor layer by depositing a second metal film above the semiconductor layer and by patterning the second metal film; forming an interlayer insulating film above the gate insulating film to cover the first electrode and the second electrode; forming a first contact hole through the gate insulating film and the interlayer insulating film, and forming a second contact hole through the interlayer insulating film; and forming, by depositing a third metal film above the interlayer insulating film and patterning the third metal film, (i) a gate line electrically connected to the gate electrode through the first contact hole, and (ii) a power supply line electrically connected to at least one of the first electrode and the second electrode through the second contact hole and adjacent to the gate line, simultaneously with the formation of the gate line are included.

According to this aspect, the thin-film semiconductor device for display apparatus according to the present disclosure can be easily manufactured.

In another aspect of the method for manufacturing the thin-film semiconductor device for display apparatus according to the present disclosure, the semiconductor layer is formed in the forming semiconductor layer and is a non-crystalline semiconductor film, and the method further includes, between the forming the semiconductor layer and the forming a first electrode and a second electrode, crystallizing the non-crystalline semiconductor film by irradiating the non-crystalline semiconductor film with a laser to heat the non-crystalline semiconductor film to a temperature within a predetermined range, for example.

According to this aspect, it is possible to form a semiconductor layer including the polycrystalline semiconductor film, and to manufacture a thin-film semiconductor device for display apparatus with good on-characteristics.

In an aspect of the EL display panel according to the present disclosure, a thin-film semiconductor array device for a display apparatus including a plurality of the thin-film semiconductor devices for the display apparatus each of which is arranged for a pixel; a plurality of lower electrodes each of which is arranged above the thin-film semiconductor array device for display apparatus for the pixel; conductive portions each of which electrically connects the thin-film semiconductor array device for display apparatus and one of the lower electrodes; a light-emitting layer above the lower electrodes; and an upper electrode above the light-emitting layer are included. Furthermore, in an aspect of the EL display panel according to the present disclosure, a bank above the thin-film semiconductor array device for display apparatus, the bank having a plurality of openings, in which the openings are formed corresponding to the lower electrodes, for example. Furthermore, in an aspect of the EL display panel according to the present disclosure, the light-emitting layer is an organic light-emitting layer, for example.

According to this aspect, it is possible to manufacture an organic EL display panel with high display capability.

In an aspect of the EL display apparatus according to the present disclosure, the EL display panel is included.

The following describes embodiments and examples of a thin-film semiconductor device for display apparatus, a method for manufacturing the thin-film semiconductor device for display apparatus, an EL display panel, and an EL display apparatus according to the present disclosure with reference to the drawings. Note that the diagrams are schematic for explanation purpose, and ratios such as thicknesses and size of the components are not always strictly accurate.

Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of appended Claims and their equivalents.

Therefore, among the structural elements in the following exemplary embodiments, structural elements not recited in any one of the independent claims are described as arbitrary structural elements.

(First Embodiment)

First, the organic electro-luminescence (EL) panel according to the first embodiment shall be described with reference to FIG. 1. FIG. 1 is a partial cutout perspective view of an organic EL display panel according to the first embodiment.

As illustrated in FIG. 1, the EL display panel 1 according to the first embodiment is an organic EL display panel (organic EL display), and includes an organic EL device 10 which is a light-emitting display device, and a thin-film semiconductor array device for display apparatus 20 composed of an active matrix substrate on which a thin-film transistor and lines are formed.

The organic EL device 10 includes lower electrodes 12, an organic light-emitting layer 13, and an upper electrode 14 that are sequentially formed on the thin-film semiconductor array device for display apparatus 20. The organic light-emitting layer 13 is composed of an electron transport layer, a light-emitting layer, a hole transport layer, and others stacked.

The thin-film semiconductor array device for display apparatus 20 includes a pixel unit in which pixels 100 are arranged in a matrix (in rows and columns), and each of the pixel 100 includes a pixel circuit 30 including a thin-film transistor (not illustrated). The thin-film semiconductor array device for display apparatus 20 includes gate lines 21 and source lines 22 arranged in a matrix. Multiple lines are arranged in row direction as the gate lines 21, and multiple lines are arranged in column direction as the source lines 22. In addition, the gate lines 21 and the source lines 22 are orthogonal to each other, and each of them is connected to each pixel circuit 30 and a control circuit (not illustrated).

Each pixel circuit 30 includes at least two thin-film transistors provided as a switching device for selecting the pixel 100 and a driving device for driving the organic EL device 10.

Note that, although not illustrated in FIG. 1, the thin-film semiconductor array device for display apparatus 20 includes power supply lines 23 arranged in row direction. The power supply lines 23 are connected to driving devices of pixels 100.

As such, the organic EL display panel 1 according to the first embodiment utilizes active matrix technology in which display control is performed for each pixel 100 partitioned by the gate lines 21 and the source lines 22.

Figure 2:
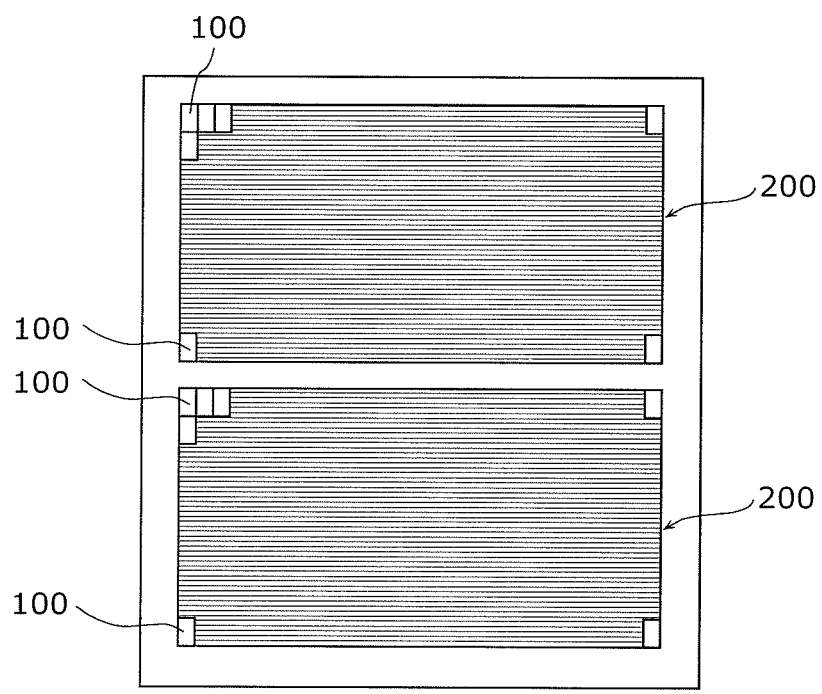
FIG. 2 illustrates a mother board of the thin-film semiconductor array device for display apparatus according to the first embodiment.

Next, an example of manufacturing the thin-film semiconductor array device for display apparatus according to the first embodiment shall be described with reference to FIG. 2. FIG. 2 illustrates a mother board of the thin-film semiconductor array device for display apparatus according to the first embodiment. As illustrated in FIG. 2, the mother board includes two display units 200, and two thin-film semiconductor array devices for display apparatus 20 are obtained by cutting the mother board into two pieces. As described above, each display unit 200 includes the pixels 100 arranged in a matrix (in rows and columns). Note that, in FIG. 2, only the pixels 100 at the corners of the display unit 200 are illustrated. In FIG. 2, it is assumed that the mother board includes two display units 200, and an example in which two displays are obtained from one mother board. However, the display unit 200 may be more than one, or only one.

Figure 3:
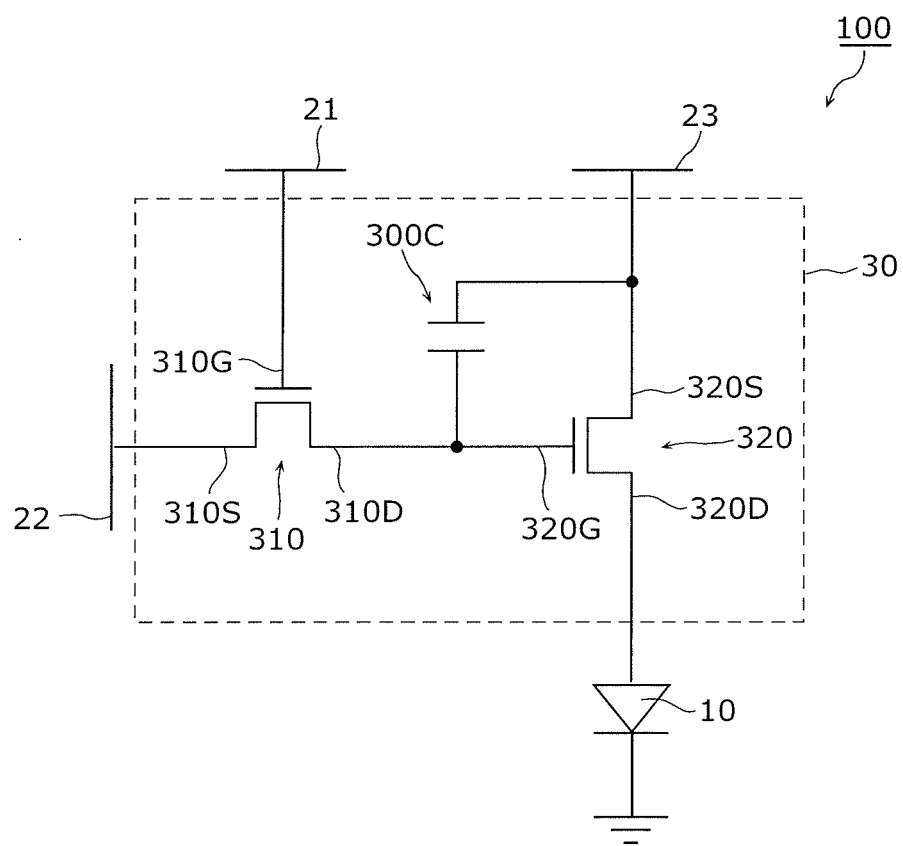
FIG. 3 illustrates a circuit configuration of one pixel in an EL display panel according to the first embodiment.

The following describes the circuit configuration of the pixel in the EL display panel according to the first embodiment with reference to FIG. 3. FIG. 3 illustrates a circuit configuration of one pixel in an EL display panel according to the first embodiment.

As illustrated in FIG. 3, each pixel 100 includes: a pixel circuit 30 including a first thin-film transistor 310, a second thin-film transistor 320, and a capacitor 300C; and an organic EL device 10. The first thin-film transistor 310 is a selecting transistor for selecting the pixel 100 (switching transistor), and the second thin-film transistor 320 is a driving transistor for driving the organic EL device 10.

The first thin-film transistor 310 includes a first source electrode 310S, a first drain electrode 310D, and a first gate electrode 310G. The first source electrode 310S is connected to the source line 22, and the first gate electrode 310G is connected to the gate line 21. Furthermore, the first drain electrode 310D is connected to the capacitor 300C and the second gate electrode 320G of the second thin-film transistor 320. When voltage is applied to the gate line 21 and the source line 22, the first thin-film transistor 310 stores the voltage value applied to the source line 22 in the capacitor 300C as display data.

The second thin-film transistor 320 includes a second source electrode 320S, a second drain electrode 320D, and a second gate electrode 320G. The second drain electrode 320D is connected to the anode (lower electrode) of the organic EL device 10, and the second source electrode 320S is connected to the power supply line 23. The second gate electrode 320G is connected to the first drain electrode 310D of the first thin-film transistor 310. The second thin-film transistor 320 supplies current corresponding to the voltage value held by the capacitor 300C to the anode of the organic EL device 10 through the second drain electrode 320D from the power supply line 23.

In the pixel 100 with the configuration described above, when the gate line 21 receives a gate signal turning on the first thin film transistor 310, the signal voltage supplied through the source line 22 is written in the capacitor 300C. The hold voltage written in the capacitor 300C is held for one frame period. With the hold voltage, the conductance of the second thin-film transistor 320 changes in an analog manner, and the driving current corresponding to gradation of light emitted flows from the anode to the cathode of the organic EL device 10. As such, the organic EL device 10 emits light, and an image is displayed.

Figure 4:
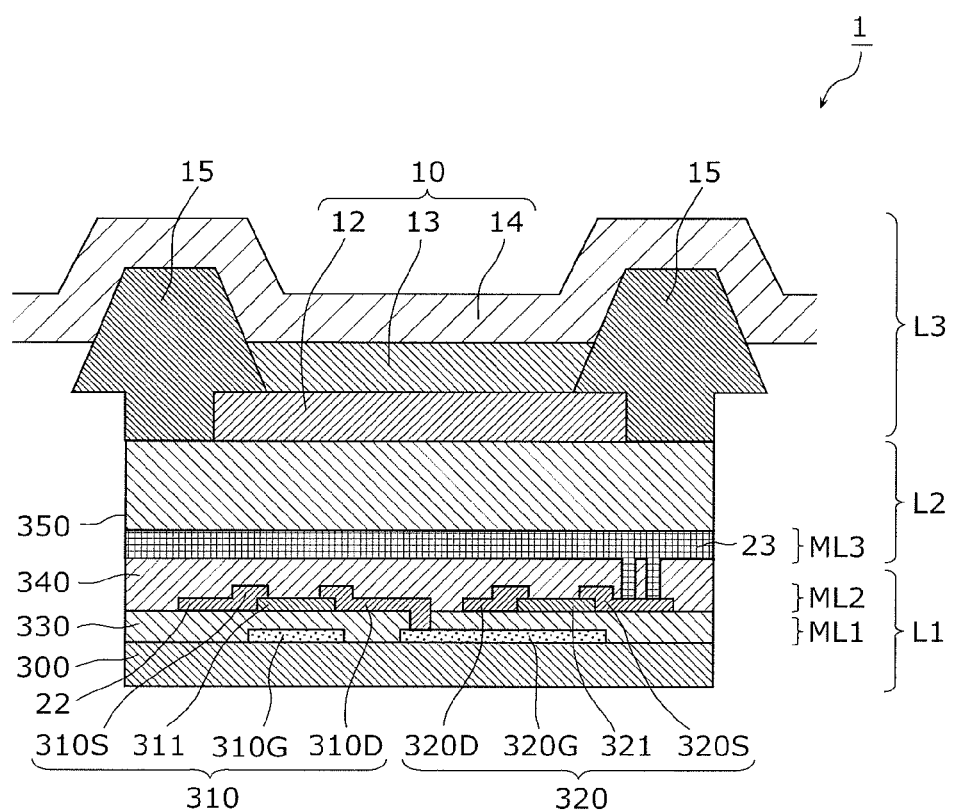
FIG. 4 is a schematic cross-sectional view of a cross sectional surface in a pixel of the EL display panel according to the first embodiment.

Next, the configuration of a pixel in the EL display panel 1 according to the first embodiment shall be described with reference to FIG. 4. FIG. 4 is a cross-sectional diagram schematically illustrating a cross-sectional surface of one pixel of the EL display panel according to the first embodiment.

As illustrated in FIG. 4, each pixel included in the EL display panel 1 according to the first embodiment includes the first thin-film transistor 310 which is a switching transistor for selecting the pixel, and the second thin-film transistor 320 which is a driving transistor for driving the organic EL device 10. As described above, the first thin-film transistor 310 includes the first source electrode 310S, the first drain electrode 310D, and the first gate electrode 310G. The second thin-film transistor 320 includes the second source electrode 320S, the second drain electrode 320D, and the second gate electrode 320G.

As illustrated in FIG. 4, the first gate electrode 310G and the second gate electrode 320G are formed on the substrate 300. Furthermore, the gate insulating film 330 is formed to cover the first gate electrode 310G and the second gate electrode 320G.

The first semiconductor layer 311 is formed above the first gate electrode 310G and on the gate insulating film 330 in each pixel. The second semiconductor layer 321 is formed above the second gate electrode 320G and on the gate insulating film 330.

One pair of the first source electrode 310S and the first drain electrode 310D are separately arranged opposite to each other, each covering part of the first semiconductor layer 311. One pair of the second source electrode 320S and the second drain electrode 320D are separately arranged opposite to each other, each covering part of the second semiconductor layer 321.

The first source electrode 310S of the first thin-film transistor 310 is electrically connected to the source line 22. The second source electrode 320S of the second thin-film transistor 320 is electrically connected to the power supply line 23.

In addition, the first interlayer insulating film (lower interlayer insulating film) 340 is formed to cover the first thin-film transistor 310 and the second thin-film transistor 320. The first interlayer insulating film 340 serves as a passivation film for protecting the first thin-film transistor 310 and the second thin-film transistor 320, for example.

The power supply line 23 is formed on the first interlayer insulating film 340. The power supply line 23 is electrically connected to the second source electrode 320S through a contact hole formed in the first interlayer insulating film 340.

The second interlayer insulating film (upper interlayer insulating film) 350 is formed on the first interlayer insulating film 340 to cover the power supply line 23. The second interlayer insulating film 350 serves as a planarizing film for planarizing an upper surface of the thin-film semiconductor device for display apparatus 2, for example. As such, a flat organic EL device 10 is formed thereon.

The organic EL device 10 including the lower electrodes 12, the organic light emitting layer 13 and the upper electrode 14 that are sequentially formed is formed on the second interlayer insulating film 350. The bank 15 is formed on the second interlayer insulating film 350 at the boundary of adjacent pixels. The lower electrode 12 and the organic light emitting layer 13 are formed in the opening between adjacent banks 15. Note that, an auxiliary line surrounding the organic light-emitting layer 13 and electrically connected to the upper electrode 14 of the organic EL device 10 is formed on the second interlayer insulating film 350.

Each of the lower electrodes 12 is an anode electrode arranged for each pixel, and is formed on the second interlayer insulating film 350. The lower electrode 12 is electrically connected to the second drain electrode 320D of the second thin-film transistor through the contact hole through the first interlayer insulating film 340 and the second interlayer insulating film 350.

The organic light-emitting layer (organic EL layer) 13 is formed for each color (sub-pixel column) or each sub pixel, and is made of a predetermined organic luminescent material.

The upper electrode 14 is a cathode electrode formed above the organic light emitting layer 13 across multiple pixels, and is made of a transparent electrode such as indium tin oxide (ITO). In this embodiment, the upper electrode 14 is a common electrode shared by all of the pixels. Note that, the upper electrode 14 has a ground potential in this embodiment.

In the EL display panel 1 with the structure described above, the lowermost layer in which the thin-film transistor is formed is referred to as a TFT layer (TFT unit) L1, the uppermost layer in which the organic EL device 10 is formed is referred to as the organic EL layer (organic EL unit) L3, and the layer between the TFT layer L1 and the organic EL layer L3 and in which the lines are formed is referred to as a line layer (line portion) L2. In this line layer L2, the power supply line 23 is formed as illustrated in FIG. 4, for example.

Furthermore, in the TFT layer L1, the layer in which the first gate electrode 310G and the second gate electrode 320G are formed is referred to as a first metal layer ML1. In addition, a layer in which a pair of first source electrode 310S and the first drain electrode 310D and a pair of the second source electrode 320S and the second drain electrode 320D are formed is referred to as a second metal layer ML2. Accordingly, as illustrated in FIG. 4, in this embodiment, the source line 22 is formed in the second metal layer ML2.

In the line layer L2, a layer in which the power supply line 23 is formed is referred to as a third metal layer ML3. Note that, as described later, the gate line 21 is also formed in the third metal layer ML3.

In the first metal layer ML1 to the third metal layer ML3, the metal material such as the electrodes and the line formed in the same metal layer can be formed by patterning the same metal film.

Figure 5:
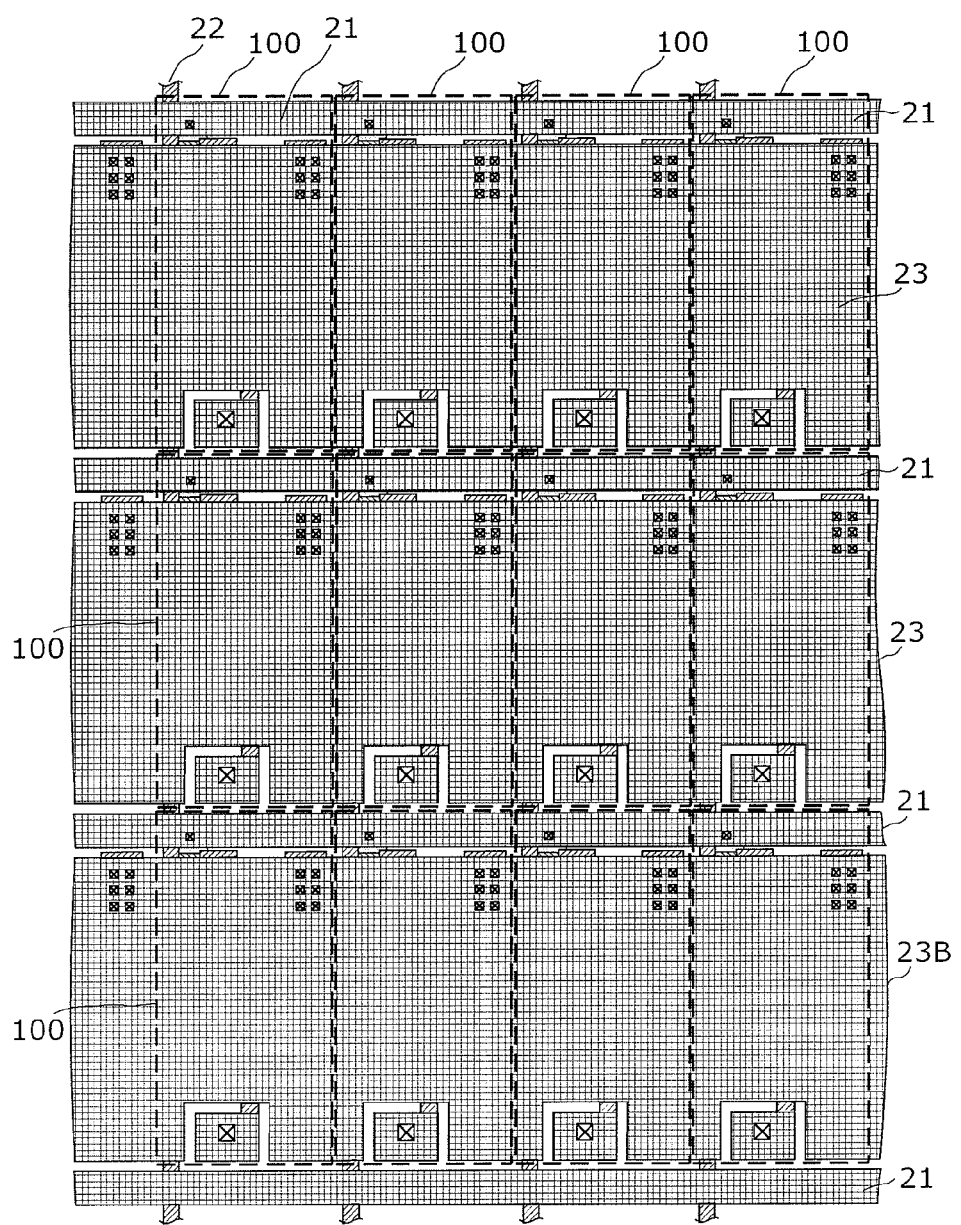
FIG. 5 is a plan view of the thin-film semiconductor array device for display apparatus according to the first embodiment.
Figure 6:
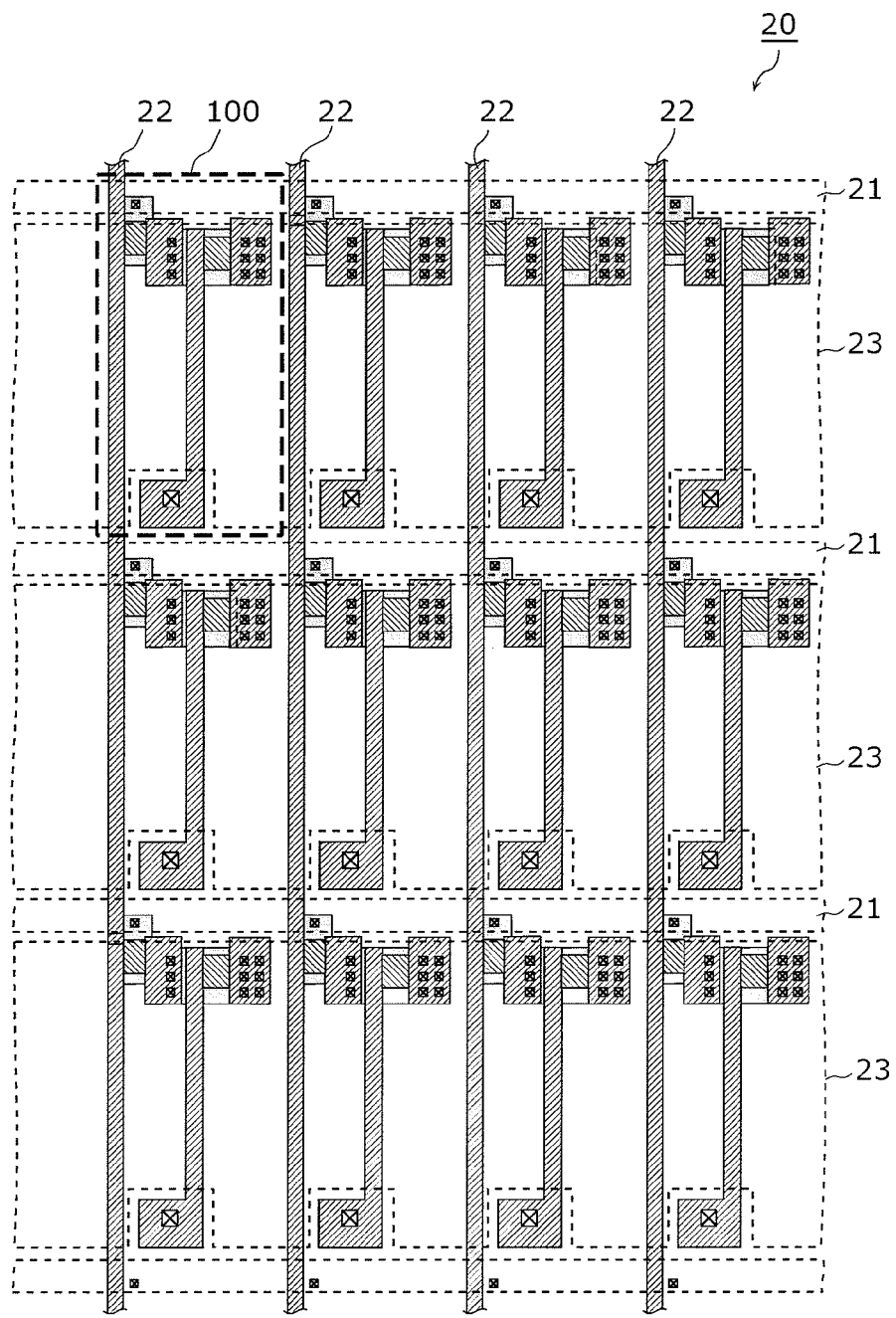
FIG. 6 is a plan view of the thin-film semiconductor array device for display apparatus (partially see-through) according to the first embodiment.

Next, the thin-film semiconductor array device for display apparatus according to the first embodiment shall be described with reference FIG. 5 and FIG. 6. FIG. 5 is a plan view of the thin-film semiconductor array device for display apparatus according to the first embodiment. FIG. 6 is a plan view of the thin-film semiconductor array device for display apparatus according to the first embodiment, seeing through the lines and the insulating film formed in the line layer L2.

As illustrated in FIG. 5, the thin-film semiconductor array device for display apparatus 20 according to the first embodiment includes pixels 100 arranged in a matrix (rows and columns), and gate lines 21 and the power supply lines 23 are arranged side-by-side with (adjacent to) one another along the column direction of the pixels 100.

The power supply line 23 is formed between adjacent gate lines 21, in the same layer as the gate line 21, and side-by-side with the gate line 21.

Note that, the gate line 21 and the power supply line 23 are formed in the third metal layer ML3 in the line layer L2 illustrated in FIG. 4. The gate line 21 and the power supply line 23 are formed on the first interlayer insulating film 340 (not illustrated).

FIG. 6 illustrates the components in FIG. 5, seeing through the gate lines 21 and the power supply lines 23. Note that, in FIG. 6, the regions in which the gate line 21 and the power supply 23 are formed are indicated in broken lines.

As illustrated in FIG. 6, the thin-film semiconductor array device for display apparatus 20 according to the first embodiment includes the source lines 22 arranged along the column direction of the pixels 100 in parallel with each other. The source lines 22 are formed in the second metal layer ML2 in the TFT layer Li illustrated in FIG. 4, and are arranged to three-dimensionally cross the gate lines 21 and the power supply lines 23 formed in the line layer L2 which is the upper layer.

Figure 7:
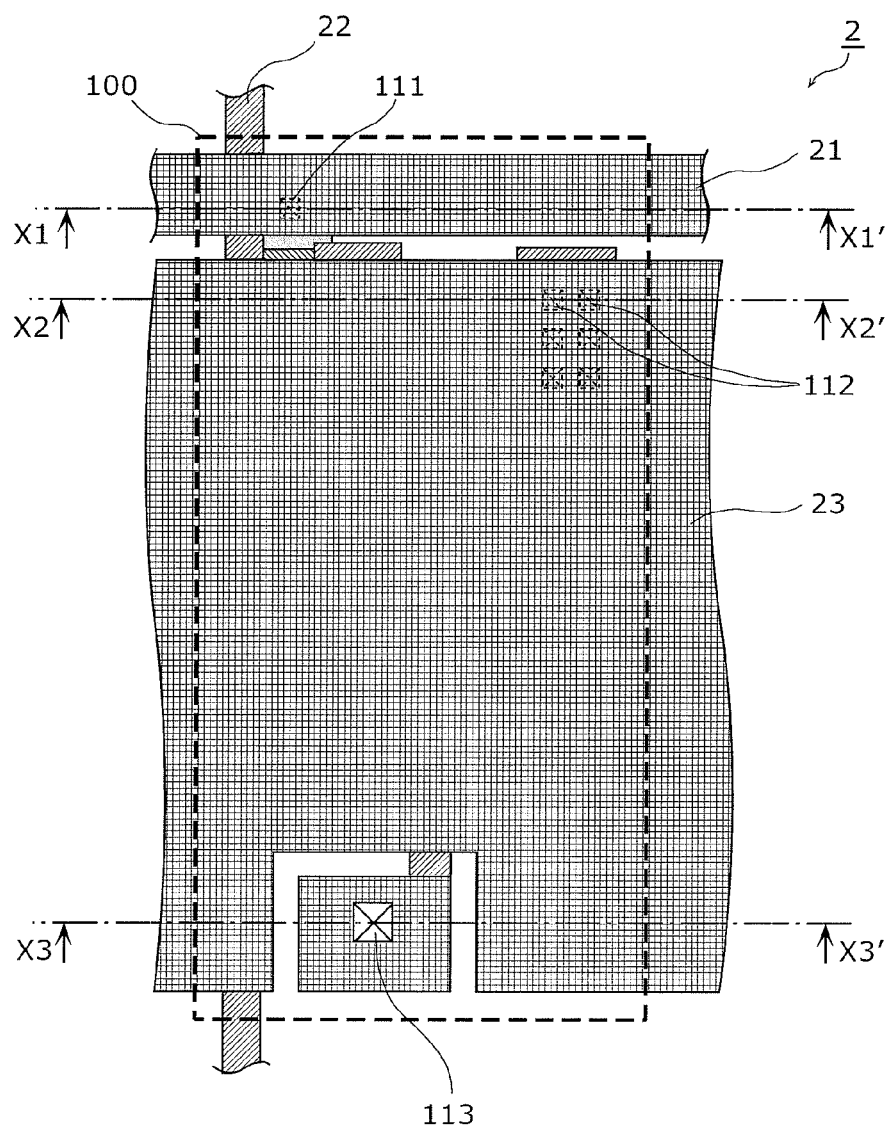
FIG. 7 is a plan view of the thin-film semiconductor device for display apparatus according to the first embodiment.
Figure 8:
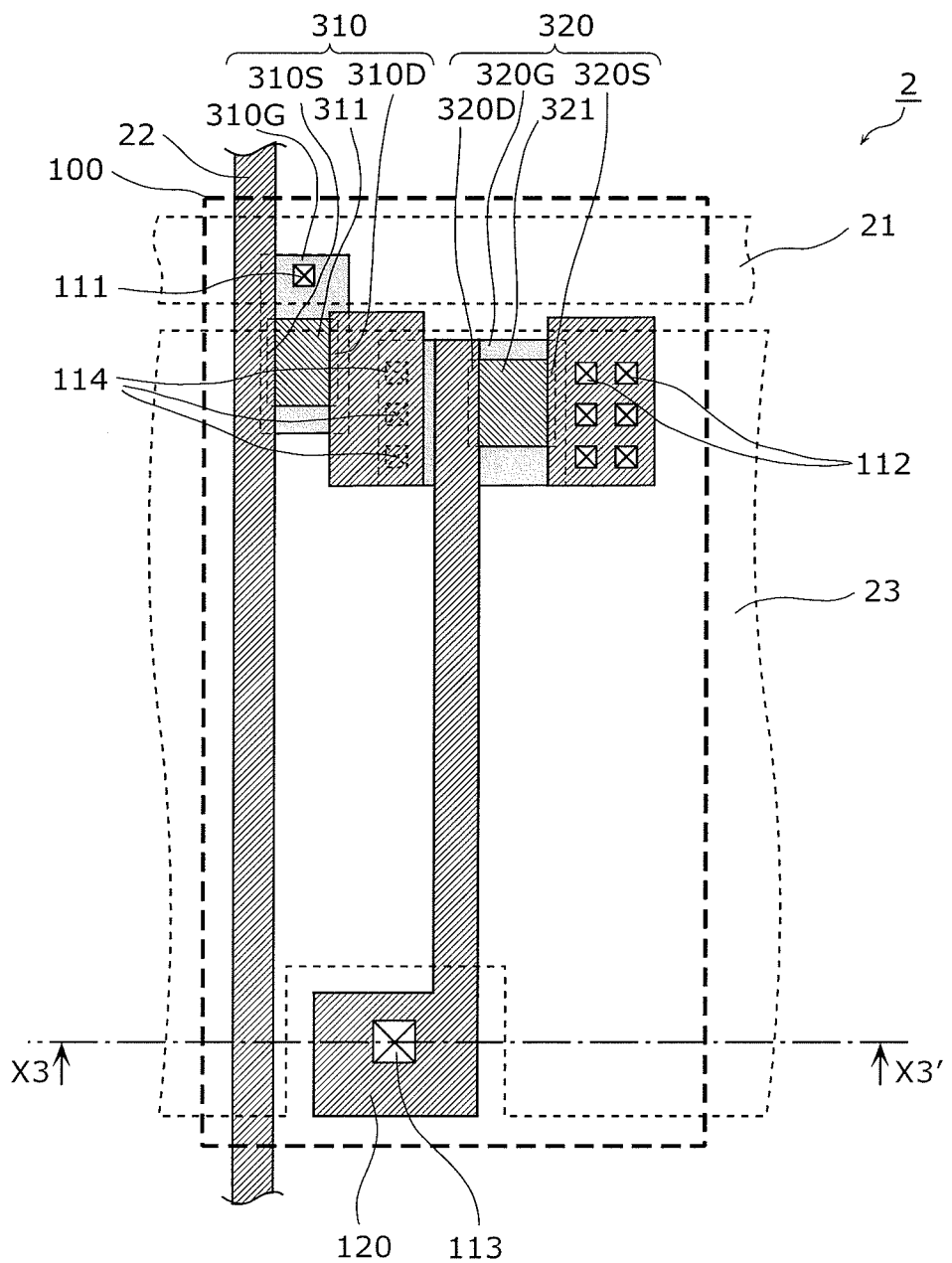
FIG. 8 is a plan view of the thin-film semiconductor device for display apparatus (partially see-through) according to the first embodiment.
Figure 9A:
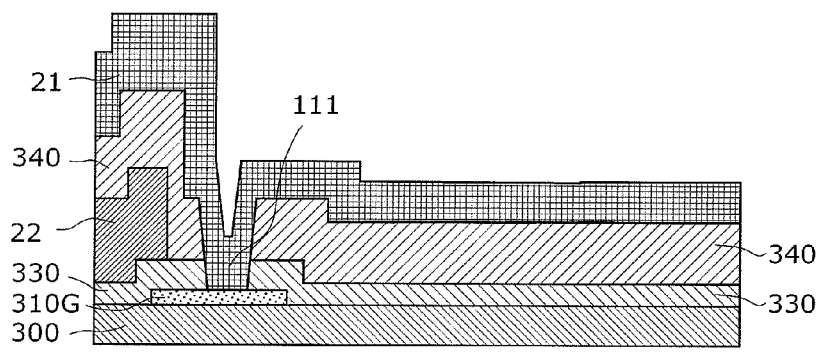
FIG. 9A is a cross-sectional view of the thin-film semiconductor device for display apparatus according to the first embodiment (a cross-sectional view along X1-X1' in FIG. 7).
Figure 9B:
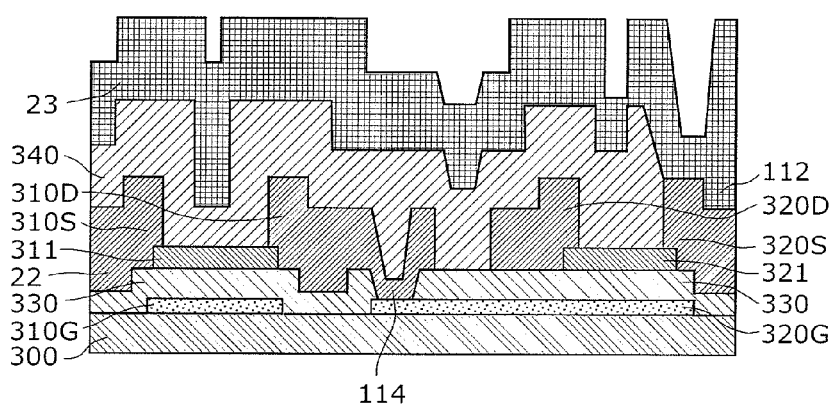
FIG. 9B is a cross-sectional view of the thin-film semiconductor device for display apparatus according to the first embodiment (a cross-sectional view along X2-X2' in FIG. 7).
Figure 10A:
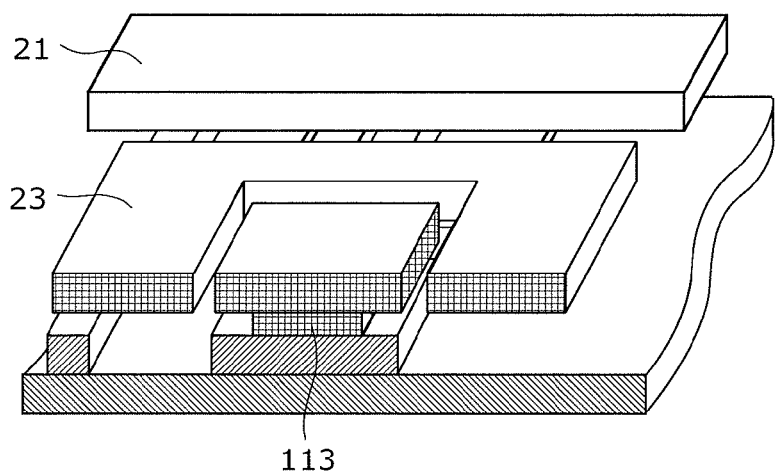
FIG. 10A is a perspective view of the thin-film semiconductor device for display apparatus according to the first embodiment in a cross-sectional surface along X3-X3' in FIG. 7.
Figure 10B:
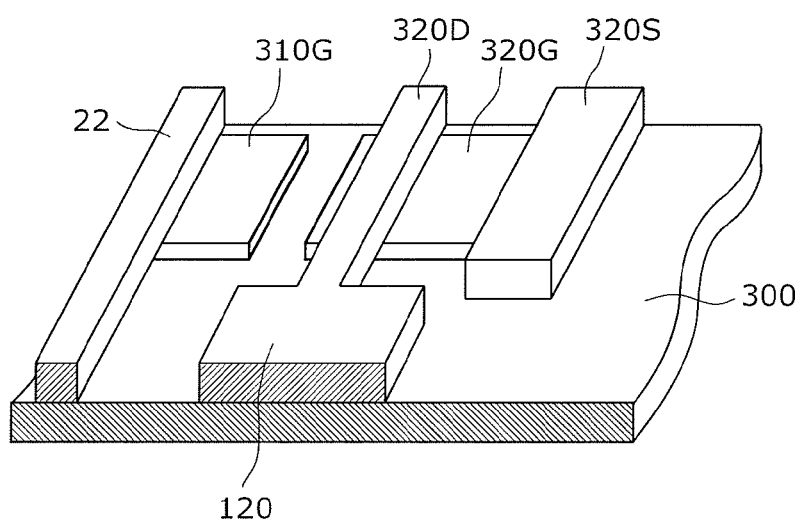
FIG. 10B is a perspective view of the thin-film semiconductor device for display apparatus according to the first embodiment in a cross-sectional surface along X3-X3' in FIG. 8.

Next, the detailed configuration of the pixel 100 in FIG. 5 and FIG. 6 shall be described with reference to FIGS. 7, 8, 9A, 9B, 10A, and 10B. FIG. 7 corresponds to each of the pixels 100 in FIG. 5, and is a plan view of the thin-film semiconductor device for display apparatus according to the first embodiment. FIG. 8 corresponds to each of the pixels 100 in FIG. 6, and is a plan view of the thin-film semiconductor device for display apparatus according to the first embodiment. Note that, FIG. 8 illustrates the thin-film semiconductor device for display apparatus, seeing through the lines and the insulating film formed in the line layer L2. FIG. 9A is a cross sectional view along X1 to X1' in FIG. 7 and FIG. 9B is a cross sectional view along X2 to X2' in FIG. 7. FIG. 10A is a perspective view of the thin-film semiconductor device for display apparatus according to the first embodiment along the cross sectional surface along X3-X3' in FIG. 7. FIG. 10B is a perspective view of the thin-film semiconductor device for display apparatus according to the first embodiment along the cross sectional surface along X3-X3' in FIG. 8.

As illustrated in FIGS. 7 and 8, the thin-film semiconductor device for display apparatus 2 according to the first embodiment includes a substrate 300, a first thin-film transistor 310, the second thin-film transistor 320, a gate line 21, a source line 22, a power supply line 23, and a first interlayer insulating film 340.

The first thin-film transistor 310 is a multilayered structure of a first gate electrode 310G, a gate insulating film 330, a first semiconductor layer 311 (channel layer), one pair of the first source electrode 310S and the first drain electrode 310D. The second thin-film transistor 320 is a multilayered structure of the second gate electrode 320G, the gate insulating film 330, the second semiconductor layer 321 (channel layer), and one pair of the second source electrode 320S and the second drain electrode 320D.

In this embodiment, the first thin-film transistor 310, the second thin-film transistor 320, and the source line 22 are formed in the TFT layer L1 illustrated in FIG. 4. Furthermore, the gate line 21 and the power supply line 23 are formed in the line layer L2 illustrated in FIG. 4.

The following specifically describes the components of thin-film semiconductor device for display apparatus 2 the according to the first embodiment from the component in the lowermost layer.

As illustrated in FIGS. 8, 9A, 9B, and 10B, the first gate electrode 310G and the second gate electrode 320G are patterned in island shape above the substrate 300. The first gate electrode 310G and the second gate electrode 320G are formed in the first metal layer ML1 illustrated in FIG. 4.

The gate insulating film 330 is formed on the substrate 300 to cover the first gate electrode 310G and the second gate electrode 320G as illustrated in FIGS. 9A and 9B.

The first semiconductor layer 311 is patterned in island shape on the gate insulating film 330 and above the first gate electrode 310G, as illustrated in FIGS. 8 and 9B. Furthermore, the second semiconductor layer 321 is patterned on the gate insulating film 330 and above the second gate electrode 320G.

Note that, the first semiconductor layer 311 and the second semiconductor layer 321 may be of N-channel type or P-channel type. In this embodiment, the first semiconductor layer 311 and the second semiconductor layer 321 are covered by the power supply line with the positive electric potential. Thus, both the first semiconductor layer 311 and the second semiconductor layer 321 are of P-channel type.

As illustrated in FIGS. 8 and 9B, the pair of the first source electrode 310S and the first drain electrode 310D in the first thin-film transistor 310 is formed above the first semiconductor layer 311 overlapping the first semiconductor layer 311 and opposite to each other. The first source electrode 310S and the first drain electrode 310D are formed in the second metal layer ML2 in the TFT layer L1 illustrated in FIG. 4.

Note that, the term "overlapping" in this specification refers to a positional relationship overlapping each other when viewed in the vertical direction.

Furthermore, as illustrated in FIGS. 8 and 9B, the first drain electrode 310D is formed to overlap the second gate electrode 320G of the second thin-film transistor 320. The first drain electrode 310D and the second gate electrode 320G are electrically connected by a fourth contact portion 114 (fourth conductive portion). The fourth contact portion 114 is formed by burying conductive material in the fourth contact hole formed in a thickness direction at a position where the first drain electrode 310D and the second gate electrode 320G overlap. In this embodiment, as illustrated in FIG. 9B, the fourth contact portion 114 is formed by burying part of the first drain electrode 310D in the fourth contact hole formed penetrating the gate insulating film 330.

Note that, as illustrated in FIG. 9B, the fourth contact hole corresponding to the fourth contact portion 114 is formed in the gate insulating film 330. In this embodiment, three fourth contact portions 114 are formed as illustrated in FIG. 8.

As illustrated in FIGS. 8 and 9B, the pair of the second source electrode 320S and the second drain electrode 320D in the second thin-film transistor 320 is formed above the second semiconductor layer 321 overlapping the second semiconductor layer 321 and opposite to each other. The first source electrode 310S and the first drain electrode 310D are formed in the second metal layer ML2 in the TFT layer L1.

Furthermore, as illustrated in FIGS. 8 and 10B, the second drain electrode 320D extends linearly along the column direction (vertical direction), and an island-shaped electrode portion 120 wider than the extended portion is formed on a side opposite to the second semiconductor layer 321.

The electrode portion 120 is electrically connected to the lower electrodes 12 of the organic EL device 10 through the third contact portion 113 (third conductive portion). The third contact portion 113 is formed by burying conductive material to the third contact hole formed through the first interlayer insulating film 340 and the second interlayer insulating film 350 formed in the upper layer of the electrode portion 120.

The source line 22 is linearly formed along the column direction of the pixels 100 (vertical direction), as illustrated in FIGS. 8, 9A, 9B, and 10B. The source line 22 is arranged to pass near the first thin-film transistor 310, and is electrically connected to the first source electrode 310S.

In this embodiment, the source line 22 and the first semiconductor layer 311 are overlapped with each other such that part of the linear source line 22 serves as the first source electrode 310S. In this embodiment, the source lines 22 are formed in the TFT layer L1 and in the second metal layer ML2, illustrated in FIG. 4.

Note that, the source line 22 is formed on the gate insulating film 330 except of for the portion overlapping with the first thin-film transistor 310. In addition, the source line 22 is formed to three-dimensionally cross the gate line 21 and the power supply line 23 to be described later, through the first interlayer insulating film 340.

As illustrated in FIGS. 9A and 9B, the first interlayer insulating film 340 is formed to cover the first thin-film transistor 310, the second thin-film transistor 320, and the source line 22. The first interlayer insulating film 340 is the uppermost layer of the TFT layer L1, and is formed to cover the entire electrodes and lines formed underneath.

The gate line 21 is linearly formed along the row direction (horizontal direction) of the pixels 100, as illustrated in FIG. 7. Furthermore, the gate line 21 is formed on the first interlayer insulating film 340 as illustrated in FIG. 9A, and is formed in the third metal layer ML3 in the line layer L2 illustrated in FIG. 4. More specifically, the gate lines 21 are formed in a layer different from the layer in which the first gate electrodes 310G and others are formed (the first metal layer ML1) and different from the layer in which the source line 22 are formed (the second metal layer ML2).

Furthermore, the gate line 21 is arranged to pass through the proximity of the first thin-film transistor 310, and is electrically connected to the first gate electrode 310G. In this embodiment, as illustrated in FIGS. 8 and 9A, the gate line 21 and the first gate electrode 310G are arranged to three-dimensionally cross each other, and at the intersection (overlapping portion), the gate line 21 and the first gate electrode 310G are electrically connected through the first contact portion 111 (first conductive portion).

The first contact portion 111 is formed by burying conductive material to the contact hole formed in the thickness direction in a position where the gate line 21 and the first gate electrode 310G overlap each other. In this embodiment, the first contact portion 111 is formed by burying part of the gate line 21 in the first contact hole (a through hole) through the first interlayer insulating film 340 and the gate insulating film 330 as illustrated in FIG. 9A.

The power supply line 23 is linearly formed along the column direction (horizontal direction) of the pixels 100, as illustrated in FIG. 7. In addition, as illustrated in FIG. 9B, the power supply line 23 is formed on the first interlayer insulating film 340, and is formed in the third metal layer ML3 in the line layer L2 illustrated in FIG. 4. More specifically, the power supply line 23 is formed in the same layer as the gate line 21 as illustrated in FIG. 10A.

Furthermore, as illustrated in FIG. 7, the power supply line 23 is arranged side-by-side with the gate line 21. Furthermore, the power supply line 23 is arranged to overlap (three-dimensionally cross) the second source electrode 320S in the second thin-film transistor 320, and at the overlapping portion (intersection), the power supply line 23 and the second source electrode 320S are electrically connected through the second contact portion 112 (second conductive portion) formed in the thickness direction.

The second contact portion 112 is formed by burying conductive material on the second contact hole (a through hole) formed through the first interlayer insulating film 340 as illustrated in FIG. 9B. In this embodiment, the second contact portion 112 is formed by burying part of the power supply line 23 on the second contact hole. In this embodiment, 6 second contact portions 112 (3 rows and 2 columns) are formed as illustrated in FIGS. 7 and 8.

Note that, in this embodiment, the material composing the power supply line 23 is composed of one element selected from Al (aluminum), Cu (copper), and Ag (silver). Alternatively, the power supply line 23 may be multilayered, and the main line composing the power supply line 23 may be made of one element selected among Al, Cu, and Ag.

As described above, the gate line 21 and the power supply line 23 are arranged to orthogonally and three-dimensionally cross the source line 22. In addition, the gate line 21 and the power supply line 23 are formed in the third metal layer ML3 in the line layer L2 on the first interlayer insulating film 340, and is formed in a layer different from the first gate electrode 310G and the second gate electrode 320G formed in the first metal layer ML1 in the TFT layer L1. Furthermore, the gate line 21 and the power supply line 23 are formed in a layer different from the second metal layer ML2 in the TFT layer L1 in which the source line 22 is formed.

Next, the method for manufacturing the thin-film semiconductor device for display apparatus 2 according to the first embodiment shall be described with reference to FIGS. 11A to 11J. FIGS. 11A to 11J are cross-sectional views schematically illustrating each process of the method for manufacturing the thin-film semiconductor device for display apparatus according to the first embodiment. Note that, FIGS. 11A to 11J correspond to the cross section along X2-X2' in FIG. 7.

Figure 11A:
FIG. 11A is a cross-sectional view schematically illustrating a substrate preparation process in the method for manufacturing the thin-film semiconductor device for display apparatus according to the first embodiment.

First, the substrate 300 is prepared as illustrated in FIG. 11A. An insulating substrate made of glass material such as quartz glass can be used for the substrate 300. Note that, an undercoating layer such as silicon oxide film or silicon nitride film may be formed on an upper surface of the substrate 300 to prevent dispersion of impurity from the substrate 300. The thickness of the undercoating layer is approximately 100 nm.

Figure 11B:
FIG. 11B is a cross-sectional view schematically illustrating a first metal layer (gate electrode) forming process in the method for manufacturing the thin-film semiconductor device for display apparatus according to the first embodiment.

Next, after washing the substrate with purified water and others, forming heat-resistant first metal film above the entire surface of the substrate 300 by sputtering, for example, and patterning the first metal film to a predetermined shape by photolithography, wet etching and others are performed to form the first gate electrode 310G and the second gate electrode 320G as illustrated in FIG. 11B. Any of heat resistant metal such as Mo, W, Ta, Ti, and Ni or their alloy may be used as the material for the first metal film. In this embodiment, the first metal film made of Mo with the thickness of approximately 100 nm is formed.

Figure 11C:
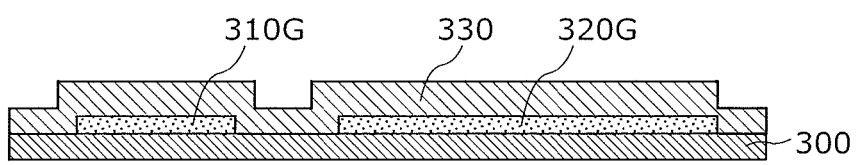
FIG. 11C is a cross-sectional view schematically illustrating the gate insulating film forming process in the method for manufacturing the thin-film semiconductor device for display apparatus according to the first embodiment.

Next, as illustrated in FIG. 11C, the gate insulating film 330 is formed on the entire surface of the substrate 300 to cover the first gate electrode 310G and the second gate electrode 320G. Silicon oxide film (SiO$_2$), silicon nitride film (SiN), or a composite film of them may be used as the material for the gate insulating film 330. In this embodiment, the thickness of the gate insulating film 330 formed is approximately 200 nm.

Figure 11D:
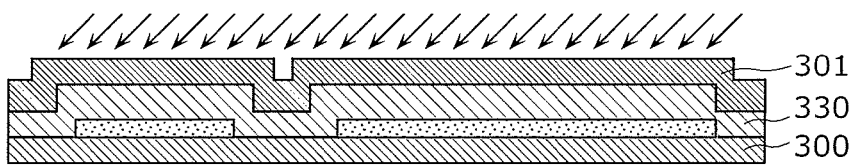
FIG. 11D is a cross-sectional view schematically illustrating a non-crystalline semiconductor film forming process and a crystalline semiconductor film forming process (laser radiation process) in the method for manufacturing the EL display panel according to the first embodiment.

Subsequently, as illustrated in FIG. 11D, non-crystalline semiconductor film 301 is formed on the gate insulating film 330. In this embodiment, an amorphous silicon film is used as the non-crystalline semiconductor film 301, and the non-crystalline semiconductor film 301 is formed with a thickness of approximately 50 nm by plasma CVD. Note that, the gate insulating film 330 and the non-crystalline semiconductor film 301 are formed by continuous plasma CVD while maintaining a vacuum state.

Subsequently, as shown in the arrows in FIG. 11D, the non-crystalline semiconductor film 301 is irradiated with laser such as excimer laser to crystallize the non-crystalline semiconductor film 301 to polysilicon semiconductor film. More specifically, by irradiating excimer laser and others on the amorphous silicon film to raise the temperature of the amorphous silicon film to a predetermined temperature range to crystallize the amorphous silicon film, and to increase the grain size to form the polysilicon semiconductor film, for example. Here, the predetermined temperature range is, for example, from 1100 to 1414 degrees Celsius. Furthermore, an average grain size of the polysilicon semiconductor is 20 nm to 60 nm.

Here, the first gate electrode 310G and the second gate electrode 320G are exposed to high temperature in the laser irradiating process. For this reason, it is preferable to form the first gate electrode 310G and the second gate electrode 320G with a metal having a melting point higher than the upper limit (1414 degrees Celsius) of the temperature range. On the other hand, lines and electrodes formed in the second metal layer ML2 and the third metal layer ML3 may be formed with the metal having a melting point lower than the lower limit of the temperature range (1100 degrees Celsius).

Note that, it is preferable to perform annealing at 400 to 500 degrees Celsius for 30 minutes as a pretreatment before irradiating laser is performed, for example. Furthermore, after irradiating laser, hydrogen plasma treatment in vacuum for a few seconds to a few dozens seconds is performed, for example.

Figure 11E:
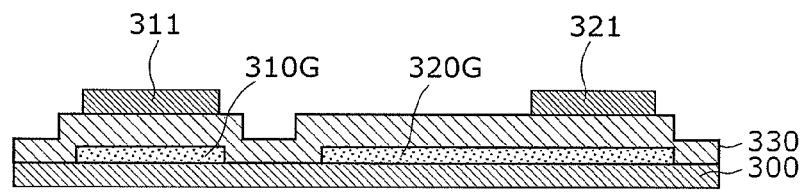
FIG. 11E is a cross-sectional view schematically illustrating a semiconductor layer forming process (an island growing process) in the method for manufacturing the thin-film semiconductor device for display apparatus according to the first embodiment.

After that, as illustrated in FIG. 11E, the crystallized non-crystalline semiconductor film 301 is patterned in an island shape to form the first semiconductor layer 311 and the second semiconductor layer 321 by photolithography, wet etching, and others.

Figure 11F:
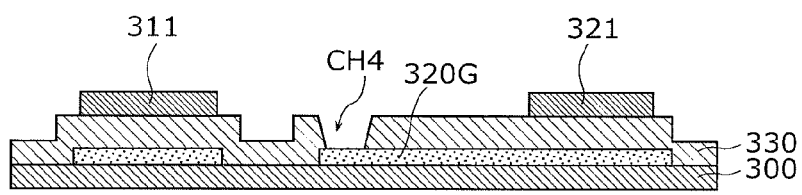
FIG. 11F is a cross-sectional view schematically illustrating the fourth contact hole forming process in a method for manufacturing the thin-film semiconductor device for display apparatus according to the first embodiment.

Next, as illustrated in FIG. 11F, the fourth contact hole CH4 through the gate insulating film 330 is formed by photolithography, wet etching, and others, to electrically connect the first drain electrode 310D and the second gate electrode 320G.

Figure 11G:
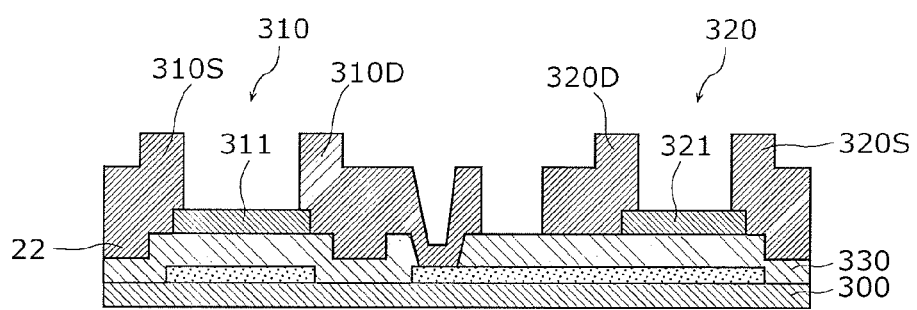
FIG. 11G is a cross-sectional view schematically illustrating a second metal layer forming process in the method for manufacturing the thin-film semiconductor device for display apparatus according to the first embodiment.

Subsequently, as illustrated in FIG. 11G, the second metal film (not illustrated) is formed by sputtering and others to cover the gate insulating film 330, the first semiconductor layer 311 and the second semiconductor layer 321 and patterning the second metal film by photolithography and wet etching to form the source line 22, the first source electrode 310S and the first drain electrode 310D, the second source electrode 320S, and the second drain electrode 320D in a predetermined shape. Here, the fourth contact hole CH4 is filled with the material composing the second metal film, forming the fourth contact portion 114.

Note that, the material composing the second metal film which includes the source line 22, the first source electrode 310S, the first drain electrode 310D, the second source electrode 320S, and the second drain electrode 320D is made of metal with low resistivity, for example. Metal such as one of Al, Cu, and Ag, or alloys of these metals can be used as the material for the second metal film. In this embodiment, the second metal film made of Al with the thickness of approximately 300 nm is formed. In addition, highly heat-resistant metal such as Mo is formed as a barrier metal on an upper side, lower side, or both of Al, for example. The thickness of the barrier metal is approximately 50 nm. Furthermore, in a case where it is necessary to further lower the resistance of lines, it is preferable to use Cu instead of Al. Alternatively, increasing the thickness of the second metal film can lower the resistance, instead of changing the material.

Furthermore, it is preferable to form a low-resistance semiconductor film between the first source electrode 310S and the first semiconductor layer 311, and between the first drain electrode 310D and the first semiconductor layer 311. An amorphous silicon film in which n-type dopant such as phosphorus is doped as impurity, or an amorphous silicon film in which p-type dopant such as boron is doped as impurity is used for the low-resistance semiconductor film. The thickness of the low resistance semiconductor film is approximately 20 nm. Furthermore, an undoped (impurity is not intentionally doped) amorphous silicon semiconductor film may be formed between the crystallized first semiconductor layer 311 and the low resistance semiconductor film (the amorphous silicon film in which impurity is doped) may be formed. Forming these films allows the desired TFT characteristics such as improvement in TFT characteristics. Note that the same applies to the second thin-film transistor 320.

Figure 11H:
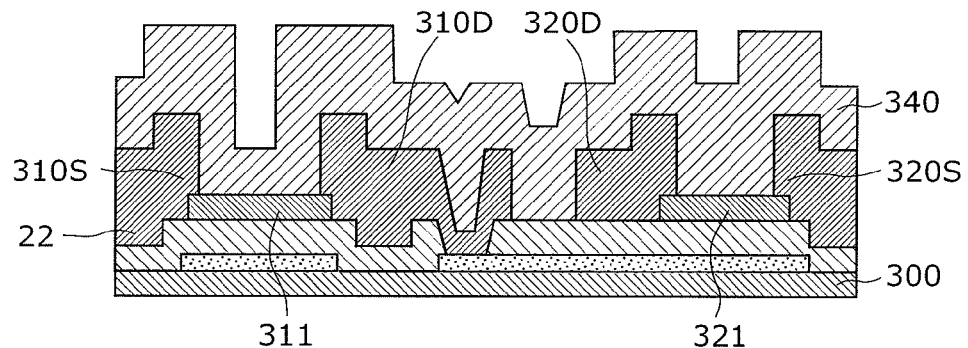
FIG. 11H is a cross-sectional view schematically illustrating a first interlayer insulating film forming process in the method for manufacturing the thin-film semiconductor device for display apparatus according to the first embodiment.

Next, as illustrated in FIG. 11H, the first interlayer insulating film 340 is formed above the entire surface of the substrate 300 by plasma CVD to cover exposed electrodes and lines such as the first source electrode 310S, the first drain electrode 310D, the second source electrode 320S, the second drain electrode 320D, and others. The first interlayer insulating film 340 may be formed with a silicon oxide film, a silicon nitride film, or a laminated film of these films.

Figure 11I:
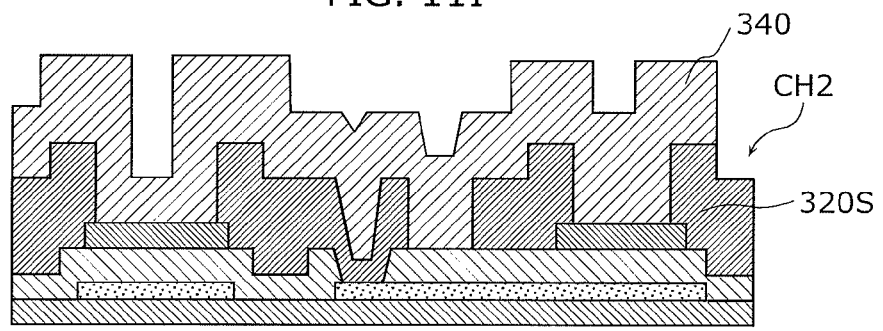
FIG. 11I is a cross-sectional view schematically illustrating the second contact hole forming process in a method for manufacturing the thin-film semiconductor device for display apparatus according to the first embodiment.

Subsequently, as illustrated in FIG. 11I, the second contact hole CH2 through the first interlayer insulating film 340 to connect the power supply line 23 and the second source electrode 320S is formed by photolithography, etching, and others. Here, though not illustrated, the first contact hole continuously passes through the first interlayer insulating film 340 and the gate insulating film 330 to connect the first gate electrode 310G and the gate line 21 is also formed.

Figure 11J:
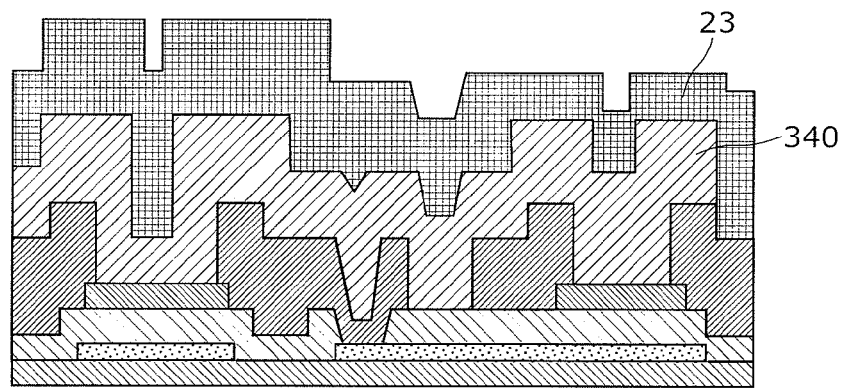
FIG. 11J is a cross-sectional view schematically illustrating a third metal layer forming process in the method for manufacturing the thin-film semiconductor device for display apparatus according to the first embodiment.

Next, as illustrated in FIG. 11J, the third metal film is formed on the first interlayer insulating film 340 by sputtering and others, and the gate line 21 and the power supply line 23 are formed by patterning the third metal film into a predetermined shape by photolithography and etching, for example. Here, the second contact hole CH2 and the first contact hole (not illustrated) are filled with the material composing the third metal film, forming the second contact portion 112 and the first contact portion 111.

Note that, the material of the third metal film composing the gate line 21 and the power supply line 23 is low resistance, for example, and can be made of the metal same as the second metal film. For example, the third metal film can be formed by forming 300 nm of Al after forming 50 nm of Mo as a barrier metal.

Though not illustrated, the second interlayer insulating film 350 is subsequently formed by plasma CVD and others. The second interlayer insulating film 350 may be formed of the material same as the first interlayer insulating film 340. For example, a silicon oxide film, a silicon nitride film, or a laminated film of these films may be used.

As such, the thin-film semiconductor device for display apparatus 2 according to the first embodiment is manufactured. Note that the thin-film semiconductor array device for display apparatus 20 is manufactured in the same manner.

As described above, in the thin-film semiconductor device for display apparatus 2 according to the first embodiment, the gate line 21 is formed in the TFT layer L2 on the first interlayer insulating film 340, and is arranged in a separate layer, that is, different from the layer in which the first gate electrode 310G (and the second gate electrode 320G) is provided. With this, material suitable for the gate line 21 and the first gate electrode 310G (and the second gate electrode 320G) can be selected separately.

Furthermore, according to the thin-film semiconductor device for display apparatus 2 according to the embodiment, the gate line and the power supply line do not cross each other. Accordingly, it is possible to eliminate parasitic capacitance in a region in which the gate line and the power supply line cross each other (overlapping region).

More specifically, in the conventional technology, the gate line and the power supply line are formed in the TFT layer, and the gate line and the power supply line are formed to cross each other through the gate insulating film. Accordingly, if the thickness of the gate insulating film is reduced in order to improve the capability of the thin-film transistors, the distance between the lines in the thickness direction at a part in which the gate line and the power supply line cross each other is reduced, increasing the parasitic capacitance between the lines. Another option for reducing the parasitic capacitance is to increase the thickness of the gate insulating film. However, since it is necessary to secure the capability of the thin-film semiconductor device, there is a limit on the thickness of the gate insulating film. Accordingly, the thickness of the gate insulating film cannot be increased further.

In contrast, in this embodiment, the gate line 21 and the power supply line 23 are provided in the same layer on the first interlayer insulating film 340 and side-by-side with each other. Accordingly, the gate line 21 and the power supply line 23 do not cross each other. To put it differently, there is no crosspoint (overlapping portion) between the gate line 21 and the power supply line 23. Accordingly, it is possible to completely prevent the parasitic capacitance generated in the region in which the gate line 21 and the power supply line 23 cross each other (the overlapping region).

Furthermore, as described above, the power supply line 23 is provided on the first interlayer insulating film 340 in the same layer as the gate line 21 and side-by-side with the gate line 21. With this structure, it is possible to fill the gap in the unevenness formed when the gate line 21 is formed on the first interlayer insulating film 340 with the power supply line 23.

More specifically, the power supply line 23 reduces the unevenness on the first interlayer insulating film 340, improving the flatness of the thin-film semiconductor device for display apparatus. As a result, it is possible to reduce the effect of the unevenness on the first interlayer insulating film 340 to the upper layer. Particularly, when the organic EL device 10 formed on the thin-film semiconductor device for display apparatus 2, it is possible to suppress the unevenness in the brightness caused by insufficient flatness. Furthermore, in this case, it is not necessary to increase the thickness of the planarizing film such as the second interlayer insulating film formed under the organic EL device 10. Thus, it is possible to achieve a thinner EL display panel.

Furthermore, according to the thin-film semiconductor device for display apparatus 2 according to the embodiment, the power supply line 23 is formed on the first interlayer insulating film 340. Accordingly, it is not necessary to form the power supply line separately between the substrate 300 and the first interlayer insulating film 340. Consequently, a large area for a region in which the thin-film transistor for a pixel is disposed is secured, and thus it is possible to improve the flexibility in designing the layout of the thin-film transistors for a pixel. In addition, it is possible to increase the area for the semiconductor layer in the thin-film transistor. Accordingly, even if the semiconductor layer is composed of a material having a low mobility of carriers, it is possible to increase the mobility of carriers by increasing the width of the transistor.

Furthermore, according to the thin-film semiconductor device for display apparatus 2 according to the embodiment, the power supply line 23 is arranged side-by-side with the gate line 21. Thus, it is possible to supply power from the common power supply line 23 to the pixels 100 arranged in the direction of the gate lines (row direction). For example, when the thin-film semiconductor device for display apparatus 2 is used for a color display panel power can be supplied from the common power supply line 23 to the pixels in red, green, and blue arranged in the direction of the gate line. With this, since it is not necessary to provide a power supply line separately for each of the pixels in red, green, and blue, a space for providing the power supply line can be reduced.

In the thin-film semiconductor device for display apparatus 2 according to the first embodiment, the power supply line 23 is formed to cover the first semiconductor layer 311 and the second semiconductor layer 321 as illustrated in FIG. 7. Thus, it is preferable to compose both the first semiconductor layer 311 and the second semiconductor layer 321 of P-channel type are formed, for example.

In the semiconductor layer (channel region) of the thin-film transistor, lattice defect may occur at the time of manufacturing on the surface of the semiconductor layer and on the surface of the interlayer insulating film covering the thin-film transistor. When the lattice defect occurs, there is an unstable interface state, causing the electric potential of the back channel of the semiconductor layer to be unstable.

Figure 12:
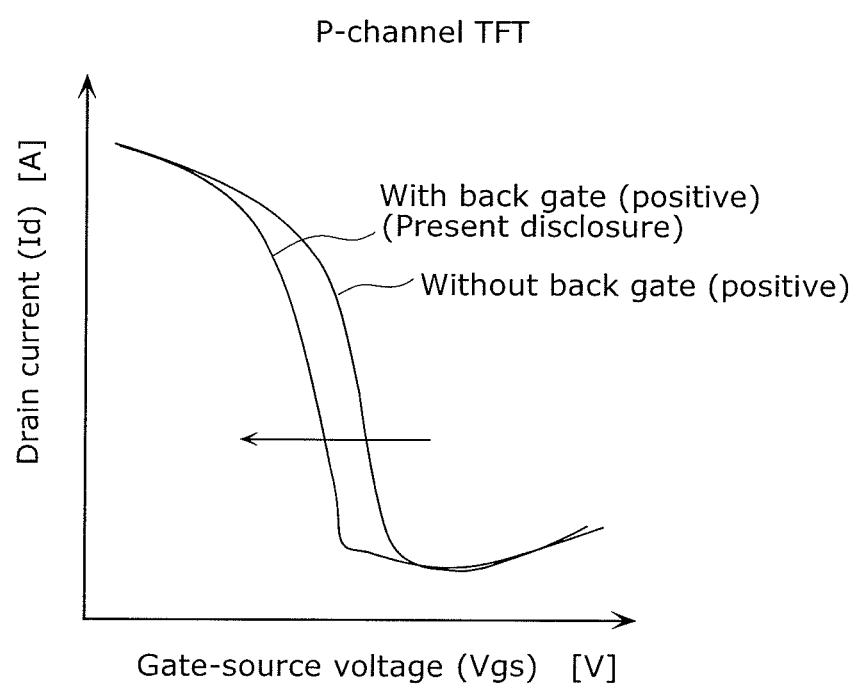
FIG. 12 is a diagram for illustrating the TFT characteristics of the thin-film transistor in the thin-film semiconductor device for display apparatus according to the first embodiment.

In the first embodiment, the P-channel first semiconductor layer 311 and the second semiconductor layer 321 are formed to overlap the power supply line 23 having the positive electric potential, forming a P-channel TFT with a back gate. With this, it is possible to stabilize the electric potential in the back channel. As a result, as illustrated in FIG. 12, the first thin-film transistor 310 and the second thin-film transistor 320 which are P-channel TFT with the back gate can achieve the effect in suppressing the off-leakage current and reducing the effect of external noise, comparable to the P-channel TFT without a back gate. This is because the back gate covers the upper side of the channel region, and serves as a shield for the electromagnetic wave to the external noise. Therefore, it is possible to implement a thin-film semiconductor device for display apparatus including the thin-film transistor with good off characteristics and highly resistant to external noise.

Note that, the effects can be achieved as long as at least part of the power supply line 23 overlaps the first semiconductor layer 311 and the second semiconductor layer 321. However, it is preferable that the power supply line 23 and the first semiconductor layer 311 or the second semiconductor layer 321 completely overlap.

In addition, in the thin-film semiconductor device for display apparatus 2 according to the first embodiment, the power supply line 23 is formed with the thickness substantially identical to the gate line 21, that is, at a height same as or close to the gate line 21, and the power supply line 23 is formed to have a width, in combination, corresponding to the width between the two adjacent gate lines 21, for example. Furthermore, it is preferable that the distance from the power supply line 23 to the two adjacent gate lines 21 is 4 pm or more.

In this embodiment, the gate line 21 is formed on the first interlayer insulating film 340. Thus, without any adjustment, the region in which the gate line 21 is formed protrudes from the region in which the gate line 21 is not formed as much as the thickness of the gate line 21, forming a depressed portion between adjacent gate lines 21.

In response to this problem, by arranging the power supply line 23 at a substantially same height as the gate line 21, and the power supply line 23 to have the width corresponding to the gap between the two adjacent gate lines 21, it is possible to ensure flatness by the power supply line 23. With this, when the organic EL device 10 is formed, the organic EL device 10 is less likely to be affected by the unevenness on the upper surface of the thin-film semiconductor device for display apparatus underneath, and thus it is possible to easily prevent the unevenness in light emission caused by insufficient flatness.

In addition, in the thin-film semiconductor device for display apparatus 2 according to this embodiment, the power supply line 23 is preferably formed at a height substantially equal to the gate line 21 and next to the two adjacent gate lines 21 to fill the interval between the two adjacent gate lines 21.

With this, the depressed portion between the adjacent gate lines 21 is buried by the power supply line 23, thereby securing flatness.

In addition, in the thin-film semiconductor device for display apparatus 2 according to the first embodiment, the power supply line 23 has a uniform thickness, along the shape of the surface of the structure under the power supply line 23.

With this, it is possible to provide a wide line for the power supply line 23, thereby making the power supply line 23 a low-resistance line. Accordingly, the power can be supplied to the second source electrode 320S through the power supply line 23 with lower line resistance, thereby significantly reducing the IR drop amount.

(Variation of the First Embodiment)

Figure 13:
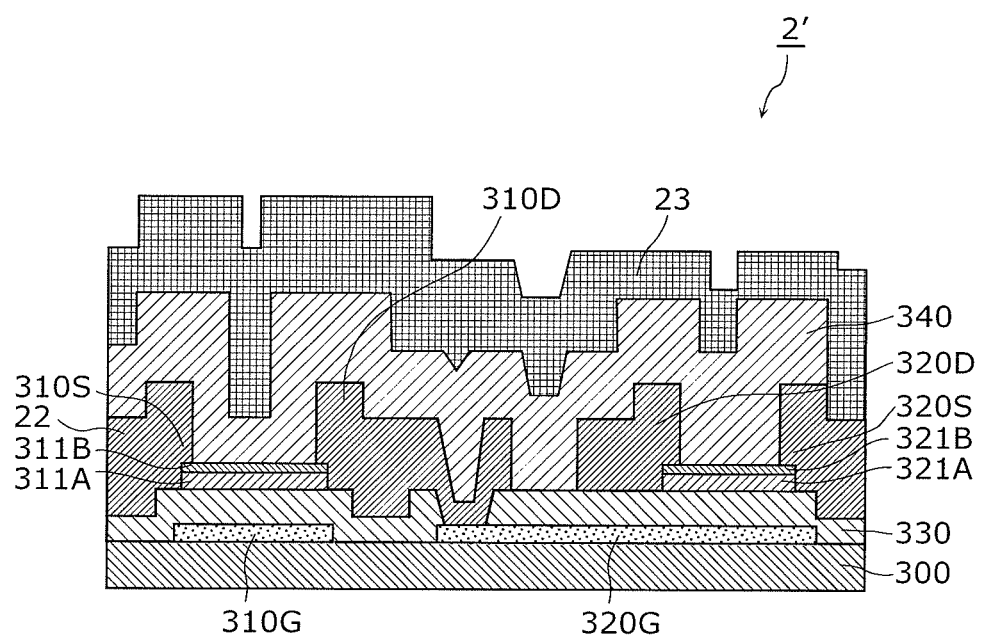
FIG. 13 is a cross-sectional view of the thin-film semiconductor device for display apparatus according to a variation of the first embodiment.

Next, a thin-film semiconductor device for display apparatus 2' according to a variation of the first embodiment shall be described with reference to FIG. 13. FIG. 13 is a cross-sectional view of the thin-film semiconductor device for display apparatus 2' according to the variation of the first embodiment. Note that, FIG. 13 corresponds to FIG. 9B, a cross sectional view of the thin-film semiconductor device for display apparatus 2 according to the first embodiment.

The thin-film semiconductor device for display apparatus 2' according to this variation has the same basic configuration as the thin-film semiconductor device for display apparatus 2 according to the first embodiment. Accordingly, in FIG. 13, the same reference numerals are assigned to the components identical to the components illustrated in FIG. 9B and detailed description for these components are omitted or simplified. Furthermore, the configuration other than the illustration in FIG. 9B is identical to the first embodiment.

The configurations of the first semiconductor layer in the first thin-film transistor 310 and the second semiconductor layer in the second thin-film transistor 320 in the thin-film semiconductor device for display apparatus 2' according to this variation are different from the thin-film semiconductor device for display apparatus 2 according to the first embodiment.

As illustrated in FIG. 13, in the thin-film semiconductor device for display apparatus 2' according to this variation, the first semiconductor layer in the first thin-film transistor 310 includes a first channel layer 311A composed of a polycrystalline semiconductor film and a second channel layer 311B composed of a non-crystalline semiconductor film. The second semiconductor layer in the second thin-film transistor 320 also includes a first channel layer 321A composed of a polycrystalline semiconductor film and a second channel layer 321B composed of a non-crystalline semiconductor film.

The first channel layer 311A and the first channel layer 321A can be composed of a polycrystalline semiconductor film formed by crystallizing an amorphous silicon film.

The second channel layer 311B and the second channel layer 321B can be composed of an amorphous silicon film in the same manner as the first semiconductor layer 311 and the second semiconductor layer 321 illustrated in FIG. 9B.

The first channel layer 311A and the first channel layer 321A composed of the polycrystalline semiconductor film can be formed by crystallizing the amorphous silicon film through laser irradiation. In plan view, the first channel layer 311A (or the first channel layer 321A) and the second channel layer 311B (or the second channel layer 321B) have the same shape, and are formed in an island-shape on the gate insulating film 330.

The thin-film semiconductor device for display apparatus 2' according to this variation can achieve the same effects as the thin-film semiconductor device for display apparatus 2 according to the first embodiment.

Furthermore, in the thin-film semiconductor device for display apparatus 2' according to this variation, the first semiconductor layer and the second semiconductor layer in thin-film transistor are formed such that the first channel layer 311A composed of the polycrystalline semiconductor film (or the first channel layer 321A) is formed under the second channel layer 311B (or the second channel layer 321B) composed of the amorphous silicon film.

With this, in the first thin-film transistor 310 and the second thin-film transistor 320, it is possible to increase carrier mobility by the first channel layer 311A and the first channel layer 321A composed of the polycrystalline semiconductor film, thereby improving on-characteristics. In addition, the second channel layer 311B and the second channel layer 321B composed of the amorphous silicon film are formed on the semiconductor layer, thereby maintaining off-characteristics.

(Second Embodiment)

Figure 14:
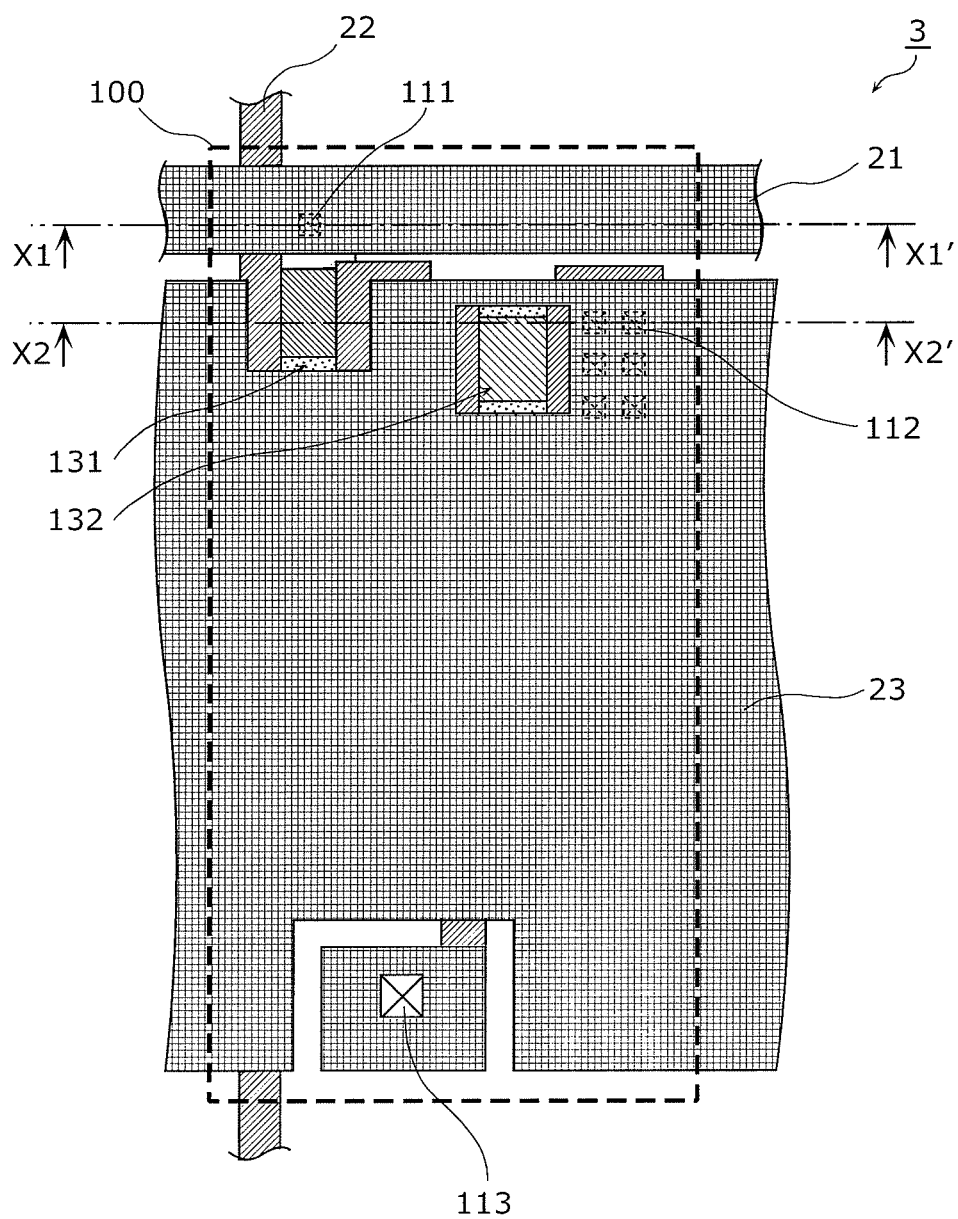
FIG. 14 is a plan view of the thin-film semiconductor device for display apparatus according to the second embodiment.
Figure 15:
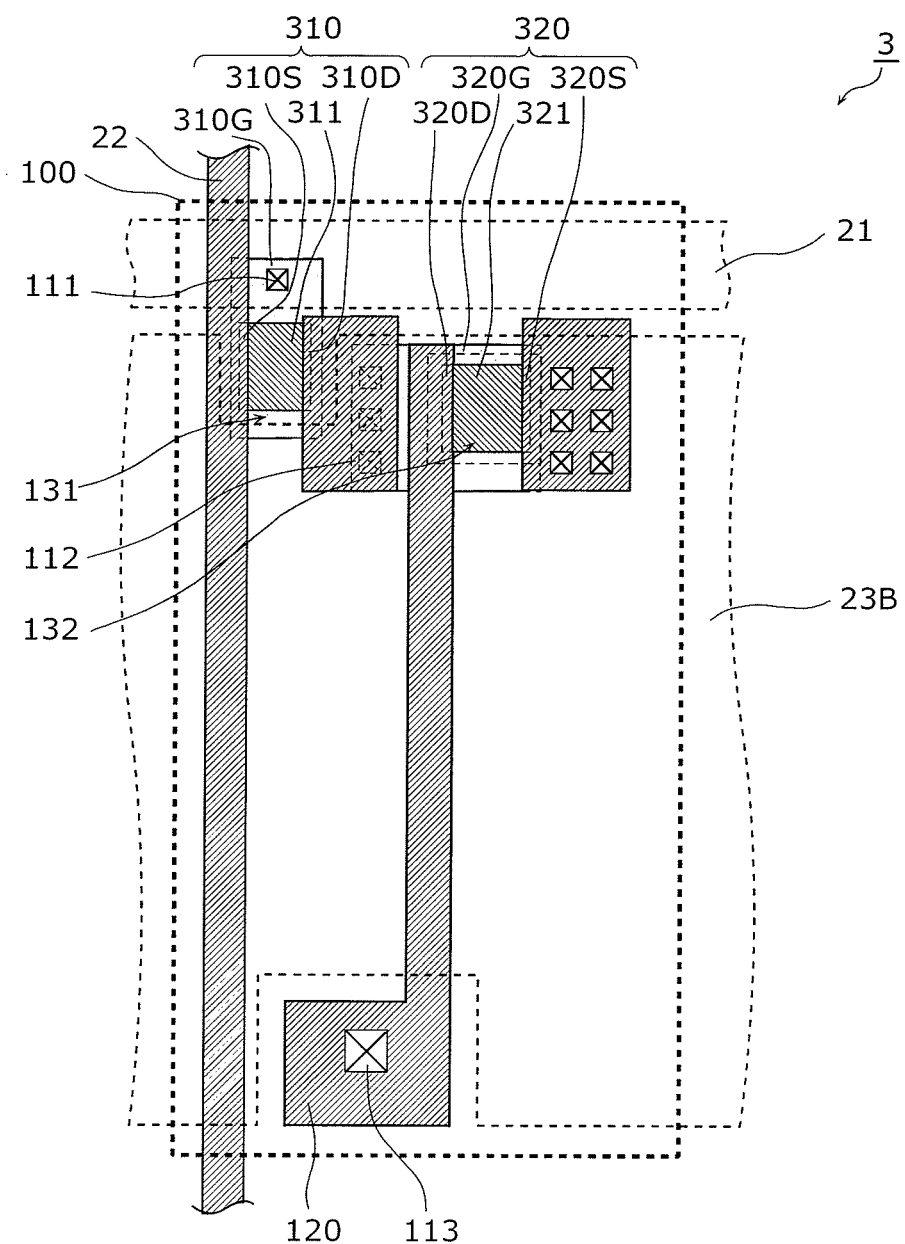
FIG. 15 is a plan view of the thin-film semiconductor array device for display apparatus (partially see-through) according to the second embodiment.
Figure 16:
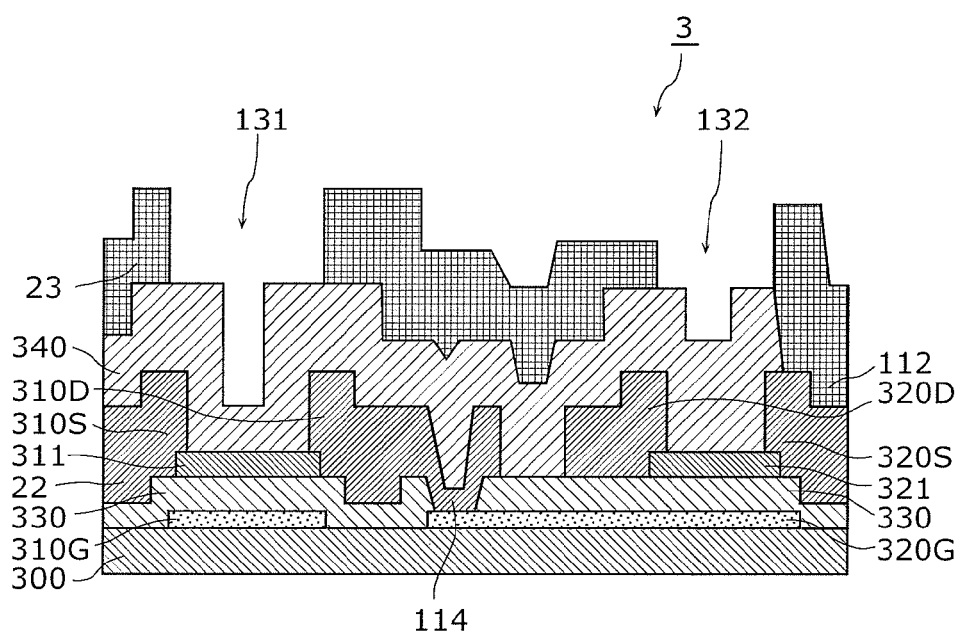
FIG. 16 is a cross-sectional view of the thin-film semiconductor array device for display apparatus according to the second embodiment (a cross-sectional view along X2-X2' in FIG. 14).

Next, the thin-film semiconductor device for display apparatus 3 according to the second embodiment shall be described with reference to FIGS. 14 to 16. FIG. 14 is a plan view of the thin-film semiconductor device for display apparatus according to the second embodiment. FIG. 15 is a plan view of the thin-film semiconductor device for display apparatus according to the second embodiment seeing through the lines and the insulating film formed in the line layer L2. FIG. 16 is a cross sectional view along X2-X2' in FIG. 14. Note that, the cross sectional surface along X1-X1' in FIG. 14 is identical to FIG. 9A.

The thin-film semiconductor device for display apparatus 3 according to the second embodiment has the same basic configuration as the thin-film semiconductor device for display apparatus 2 according to the first embodiment. Accordingly, in FIGS. 14 to 16, the same reference numerals are assigned to the components identical to the components illustrated in FIGS. 7 to 9B and detailed description for these components are omitted or simplified.

The thin-film semiconductor device for display apparatus 3 according to the second embodiment is different from the thin-film semiconductor device for display apparatus 2 according to the first embodiment in the channel type of the first semiconductor layer 311 and the second semiconductor layer 321, and the structure of the power supply line 23. Note that the rest of the configuration is identical to the first embodiment.

As illustrated in FIGS. 14 to 16, in the thin-film semiconductor device for display apparatus 3 according to the second embodiment, the power supply line 23 is arranged not to overlap the first semiconductor layer 311 and the second semiconductor layer 321, and includes a first opening 131 formed on the first semiconductor layer 311 and a second opening 132 formed on the second semiconductor layer 321.

In this embodiment, both the first semiconductor layer 311 and the second semiconductor layer 321 are of N-channel type.

The thin-film semiconductor device for display apparatus 3 according to the second embodiment can be manufactured in the same manner as in the first embodiment. However, in this embodiment, it is necessary to form the first opening 131 and the second opening 132 in the power supply line 23. The first opening 131 and the second opening 132 can be formed by forming openings in portions where the power supply line 23 overlaps with the first semiconductor 311 or the second semiconductor layer 321 at the time of patterning the third metal film.

As described above, according to the thin-film semiconductor device for display apparatus 3 of the second embodiment, in the same manner as the first embodiment, it is possible to form the gate lines 21 and the first gate electrodes 310G as separate layers. Thus, it is possible to select a material suitable for each layer.

Furthermore, since the gate line 21 and the power supply line 23 do not cross each other, it is possible to eliminate the parasitic capacitance in the region in which the gate line 21 and the power supply line 23 cross each other (the overlapping region).

Furthermore, the power supply lines 23 is formed in the same layer as the gate lines 21 and are arranged side-by-side with the gate lines 21, thereby reducing the unevenness on the first interlayer insulating film 340 due to the gate line 21, improving the flatness.

Furthermore, the power supply line 23 is formed on the first interlayer insulating film 340, and it is not necessary to form another power supply line under the first interlayer insulating film 340. Accordingly, it is possible to secure a large area for the thin-film transistor for one pixel.

Furthermore, the power supply line 23 is arranged side-by-side with the gate line 21. Accordingly, it is possible to supply power from the common power supply line 23 to the pixels 100 arranged in the direction of the gate lines. With this, it is possible to reduce a space for arranging the power supply line for the pixels in the row direction.

Furthermore, the thin-film semiconductor device for display apparatus 3 according to this embodiment achieves the following effects.

When the power supply line 23 with positive electric potential covers the first interlayer insulating film 340 above the first semiconductor layer 311 and the second semiconductor layer 321 of N-channel type, negative carriers are induced at the back channel of the first semiconductor layer 311 and the second semiconductor layer 321, generating off-leakage current. Therefore, a current is generated without applying the gate voltage. As a result, the off-characteristics of the first thin-film transistor 310 and the second thin-film transistor 320 are decreased.

Figure 17:
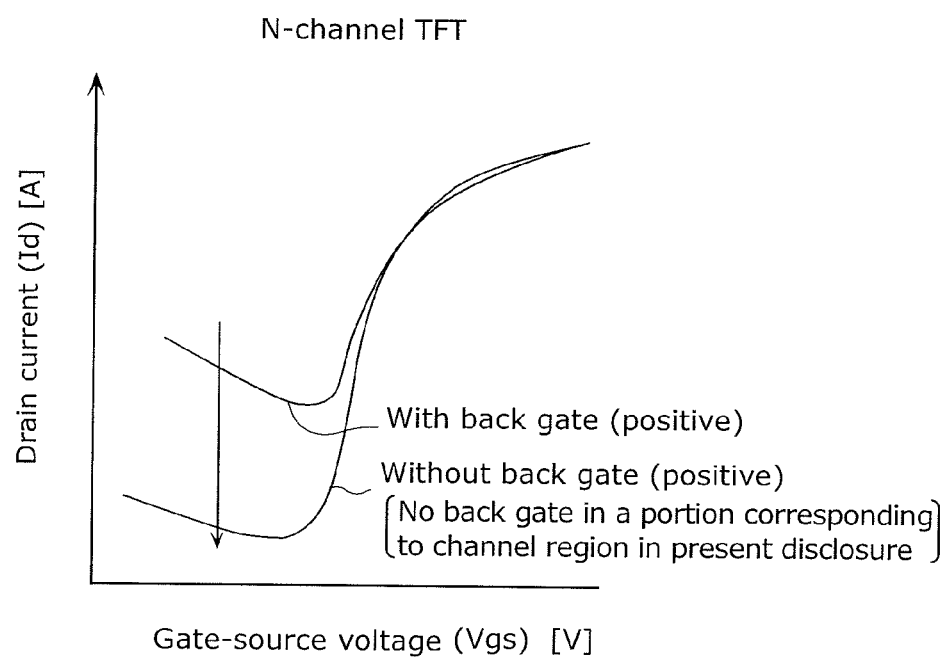
FIG. 17 is a diagram for illustrating the TFT characteristics of the thin-film transistor in the thin-film semiconductor device for display apparatus according to the second embodiment.

In contrast, in thin-film semiconductor device for display apparatus 3 according to this embodiment, the semiconductor layer 311 and the second semiconductor layer 321 of N-channel type are arranged not to overlap the power supply line 23 with positive electric potential, composing N-channel TFT without a back gate. As a result, as illustrated in FIG. 17, with regard to the first thin-film transistor 310 and the second thin-film transistor 320 which are the N-channel TFTs without back gate, the power supply line 23 suppresses the induced carriers at the back channel, compared to the N-channel TFT with a back gate. As a result, it is possible to reduce the off-leakage current at the first thin-film transistor 310 and the second thin-film transistor 320. Therefore, it is possible to implement the thin-film semiconductor device for display apparatus with thin-film transistors with good off-characteristics.

Note that, the effect described above can be achieved as long as at least part of the power supply line 23 is arranged not to overlap the first semiconductor layer 311 or the second semiconductor layer 321. However, it is preferable to arrange the power supply line 23 not to overlap with the first semiconductor layer 311 or the second semiconductor layer 321 at all.

(Variation of the Second Embodiment)

Figure 18:
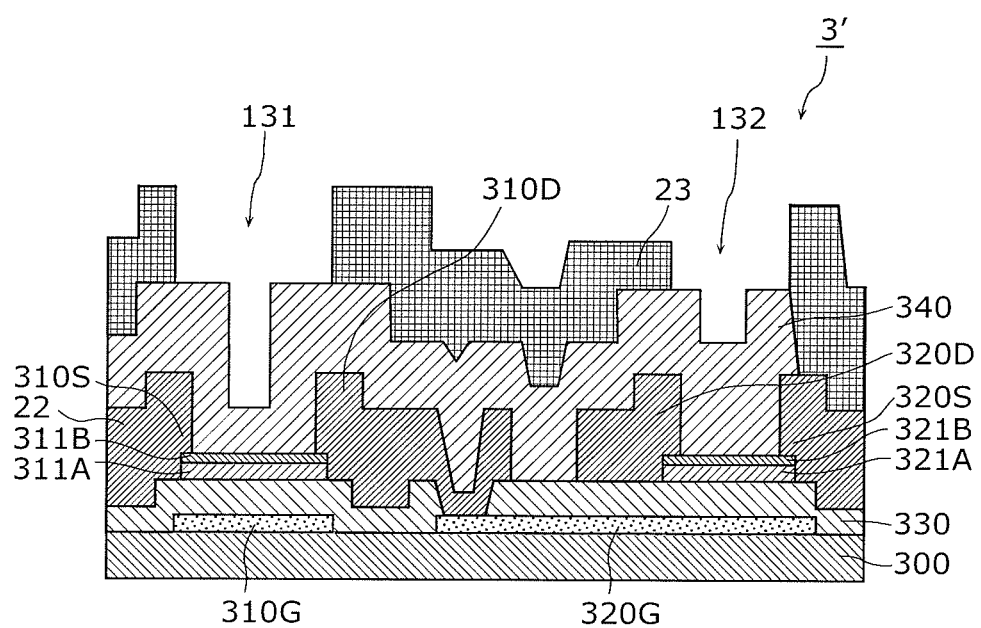
FIG. 18 is a cross-sectional view of the thin-film semiconductor device for display apparatus according to a variation of the second embodiment.

Next, a thin-film semiconductor device for display apparatus 3' according to a variation of the second embodiment shall be described with reference to FIG. 18. FIG. 18 is a cross-sectional view of the thin-film semiconductor device for display apparatus 3' according to the variation of the second embodiment. Note that, FIG. 18 corresponds to FIG. 16, a cross sectional view of the thin-film semiconductor device for display apparatus 3 according to the second embodiment.

The thin-film semiconductor device for display apparatus 3' according to this variation has the same basic configuration as the thin-film semiconductor device for display apparatus 3 according to the second embodiment. Accordingly, in FIG. 18, the same reference numerals are assigned to the components identical to the components illustrated in FIG. 16, and detailed description for these components are omitted or simplified. Furthermore, the configuration other than the illustration in FIG. 18 is identical to the second embodiment.

The configurations of the first semiconductor layer in the first thin-film transistor 310 and the second semiconductor layer in the second thin-film transistor 320 in the thin-film semiconductor device for display apparatus 3' according to this variation are different from the thin-film semiconductor device for display apparatus 3 according to the second embodiment.

As illustrated in FIG. 18, in the thin-film semiconductor device for display apparatus 3' according to this variation, the first semiconductor layer in the first thin-film transistor 310 includes a first channel layer 311A composed of a polycrystalline semiconductor film and a second channel layer 311B composed of a non-crystalline semiconductor film. The second semiconductor layer in the second thin-film transistor 320 also includes a first channel layer 321A composed of a polycrystalline semiconductor film and a second channel layer 321B composed of a non-crystalline semiconductor film.

The first channel layer 311A and the first channel layer 321A can be composed of a polycrystalline semiconductor film formed by crystallizing an amorphous silicon film.

The second channel layer 311B and the second channel layer 321B are composed of amorphous silicon film.

The first channel layer 311A and the first channel layer 321A composed of the polycrystalline semiconductor film can be formed by crystallizing the upper layer of the amorphous silicon film through laser irradiation. In plan view, the first channel layer 311A (or the first channel layer 321A) and the second channel layer 311B (or the second channel layer 321B) have the same shape, and are formed in an island-shape on the gate insulating film 330.

The thin-film semiconductor device for display apparatus 3' according to this variation can achieve the same effects as the thin-film semiconductor device for display apparatus 3 according to the second embodiment.

Furthermore, in the thin-film semiconductor device for display apparatus 3' according to this variation, the first semiconductor layer and the second semiconductor layer in thin-film transistor are formed such that the first channel layer 311A composed of the polycrystalline semiconductor film (or the first channel layer 321A) is formed under the second channel layer 311B (or the second channel layer 321B) composed of the amorphous silicon film.

With this, in the first thin-film transistor 310 and the second thin-film transistor 320, it is possible to increase carrier mobility by the first channel layer 311A and the first channel layer 321A composed of the polycrystalline semiconductor film, thereby improving on-characteristics. In addition, the second channel layer 311B and the second channel layer 321B composed of the amorphous silicon film are formed on the semiconductor layer, thereby maintaining off-characteristics.

EXAMPLE 1

Figure 19A:
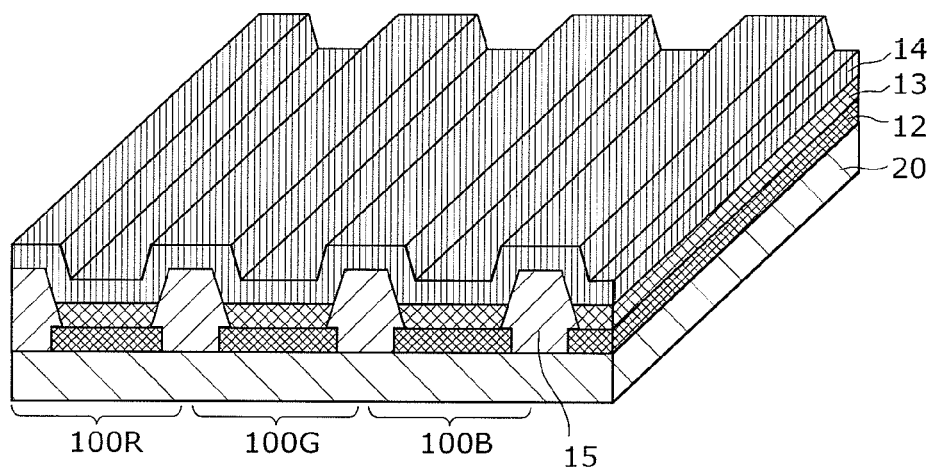
FIG. 19A is a cross-sectional perspective view of the organic EL display panel according to the present disclosure.
Figure 19B:
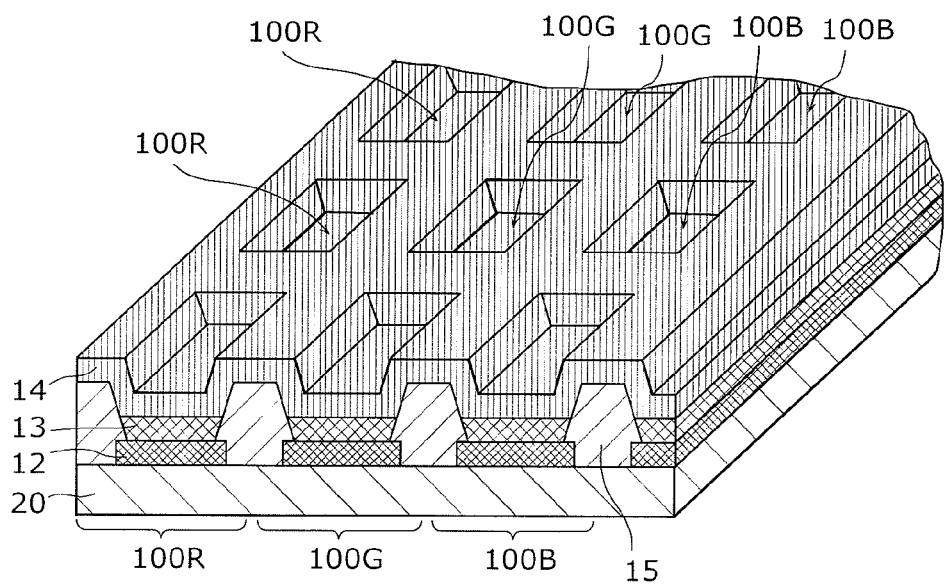
FIG. 19B is a cross-sectional perspective view illustrating another example of the organic EL display panel according to the present disclosure.

Next, an example of organic EL display panel in which thin-film semiconductor device for display apparatus according to the embodiments is used shall be described with reference to FIGS. 19A and 19B. FIG. 19A is a cross-sectional perspective view of an example of the organic EL display panel according to the present disclosure. FIG. 19B is a cross-sectional perspective view of an example of the organic EL display panel according to the present disclosure.

As illustrated in FIGS. 19A and 19B, the pixels 100 of the organic EL display panel include sub-pixels 100R, 100G, and 100B in three colors (red, green, and blue). Multiple sub-pixels 100R, 100G, and 100B are arranged in a depth direction of the FIGS. 19A and 19B (referred to as sub-pixel columns).

FIG. 19A illustrates an example of line banks, and the sub-pixel columns are separated by the banks 15. Each of the banks 15 illustrated in FIG. 19A includes a protrusion extending between the adjacent sub-pixel columns in a direction in parallel with the source lines 22, and is formed on the thin-film semiconductor array device for display apparatus 20. In other words, each of the sub-pixel columns is formed between the adjacent protrusions (that is, an opening of the bank 15).

The lower electrode 12 is formed on the thin-film semiconductor array device for display apparatus 20 (more specifically, on the second interlayer insulating film 350), and inside the opening of the bank 15 for each sub-pixel 100R, 100G, or 100B. The organic light emitting layer 13 is formed on the lower electrode 12 and inside the opening of the bank 15 for each sub-pixel column (that is, to cover the lower electrodes 12 in each column). The upper electrode 14 is continuously formed on the organic light-emitting layer 13 and the banks 15 to cover all of the sub-pixels 100R, 100G, and 100B.

FIG. 19B illustrates an example of pixel banks, and each sub-pixel 100R, 100G, or 100B is separated by the banks 15. The banks 15 illustrated in FIG. 19B include protrusions extending in parallel with the gate lines 21 and protrusions extending in parallel with the source lines 22 in parallel crossing each other. The sub-pixels 100R, 100G, and 100B are formed in the portions surrounded by the protrusions (that is, openings of the bank 15).

The lower electrode 12 is formed on the thin-film semiconductor array device for display apparatus 20 (more specifically, on the second interlayer insulating film 350), and inside the opening of the bank 15 for each sub-pixel 100R, 100G, or 100B. Similarly, the organic light-emitting layer 13 is formed on the lower electrodes 12 and inside the openings of the bank 15 for each of the sub-pixels 100R, 100G, and 100B. The upper electrode 14 is continuously formed on the organic light-emitting layer 13 and the banks 15 (multiple protrusions) to cover all of the sub-pixels 100R, 100G, and 100B.

Note that, although not shown in FIGS. 19A and 19B, the thin-film semiconductor array device for display apparatus 20 includes a pixel circuit 30 for each of the sub-pixels 100R, 100G, and 100B. Furthermore, the sub-pixels 100R, 100G, and 100B are identical except the property of the organic light-emitting layer 13 (color of luminescence).

The thin-film semiconductor device for display apparatus according to the embodiments of the present disclosure is not only applicable to the line bank illustrated in FIG. 19A, but also to the pixel bank illustrated in FIG. 19B.

EXAMPLE 2

Figure 20:
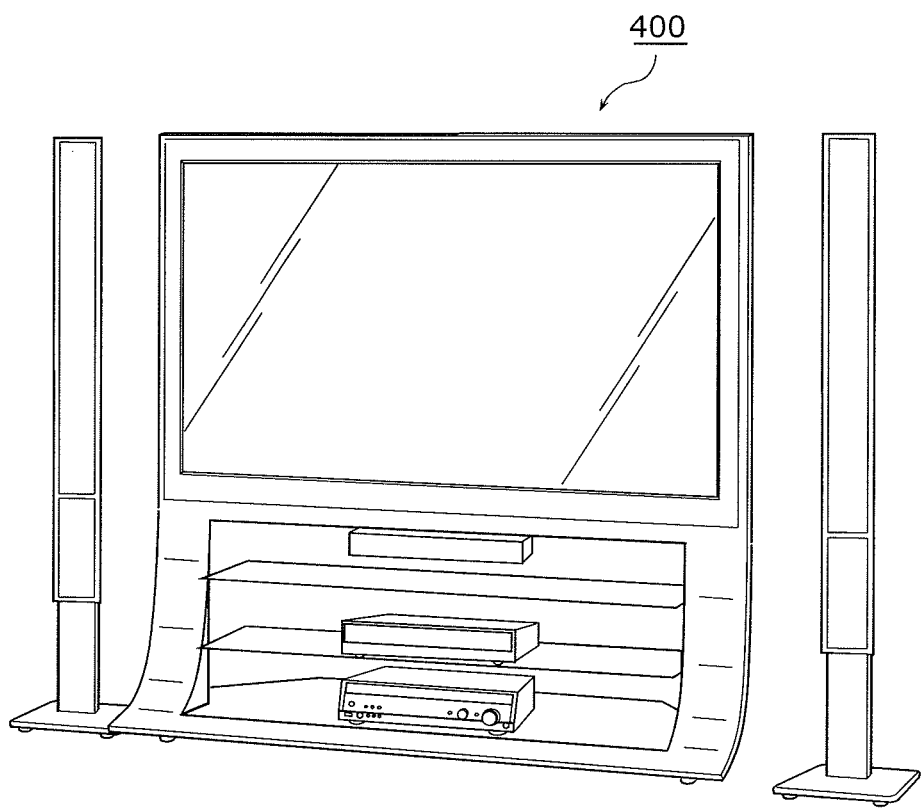
FIG. 20 is an external perspective view illustrating an example of the EL display apparatus according to the present disclosure.
Figure 21:
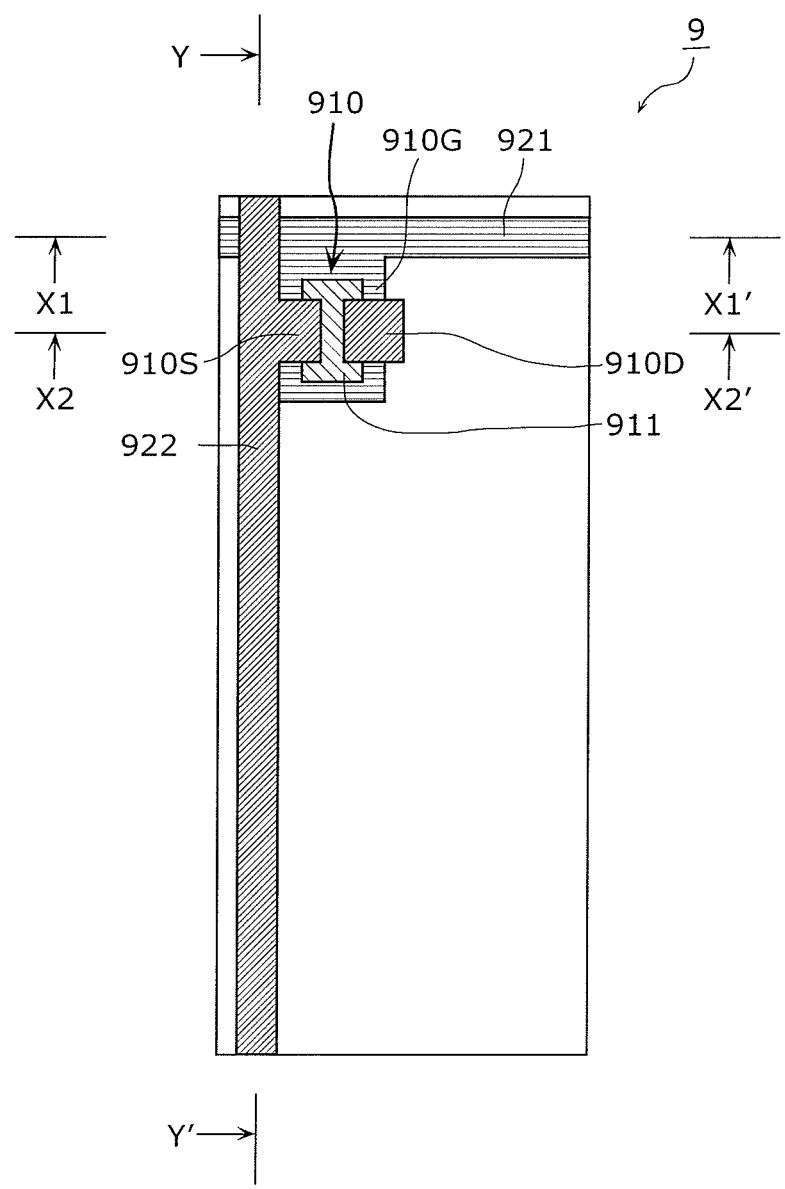
FIG. 21 is a plan view of the conventional thin-film semiconductor device for display apparatus in one pixel of the display apparatus.
Figure 22A:
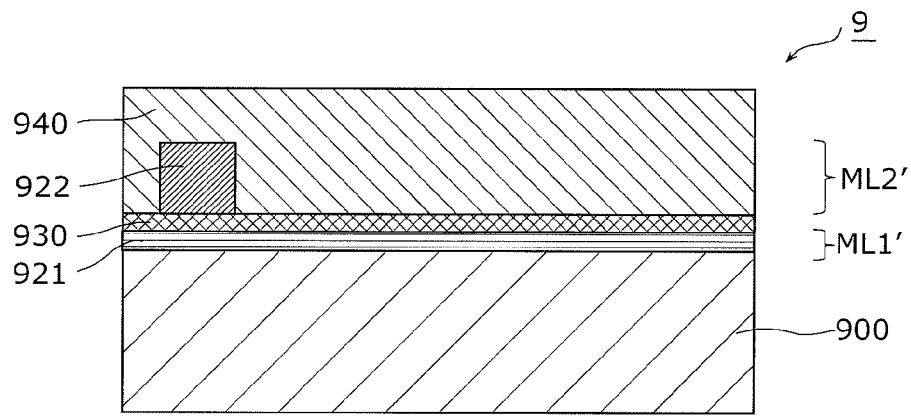
FIG. 22A is a cross-sectional view of the conventional thin-film semiconductor device for display apparatus (cross-sectional view along X1-X1' in FIG. 21).
Figure 22B:
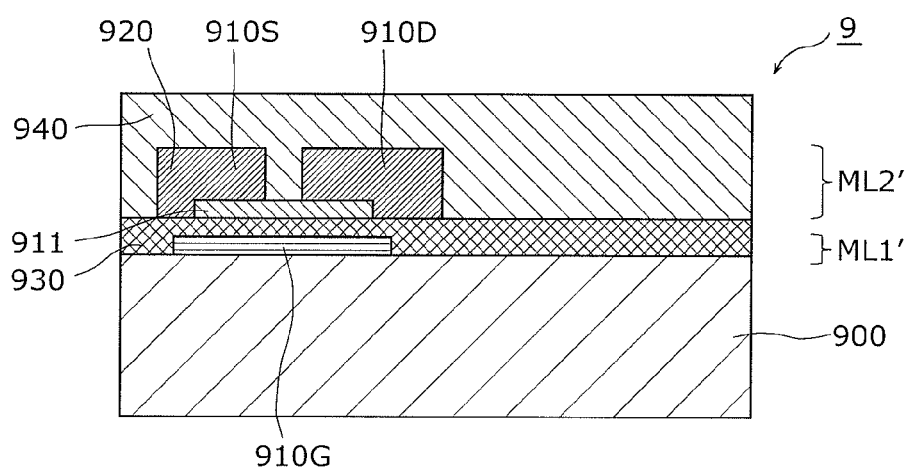
FIG. 22B is a cross-sectional view of the conventional thin-film semiconductor device for display apparatus (cross-sectional view along X2-X2' in FIG. 21).
Figure 22C:
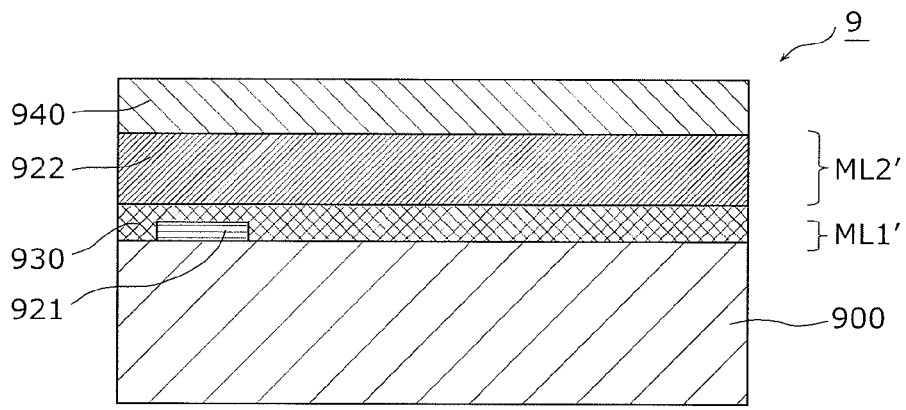
FIG. 22C is a cross-sectional view of the conventional thin-film semiconductor device for display apparatus (cross-sectional view along Y-Y' in FIG. 21).
Figure 23:
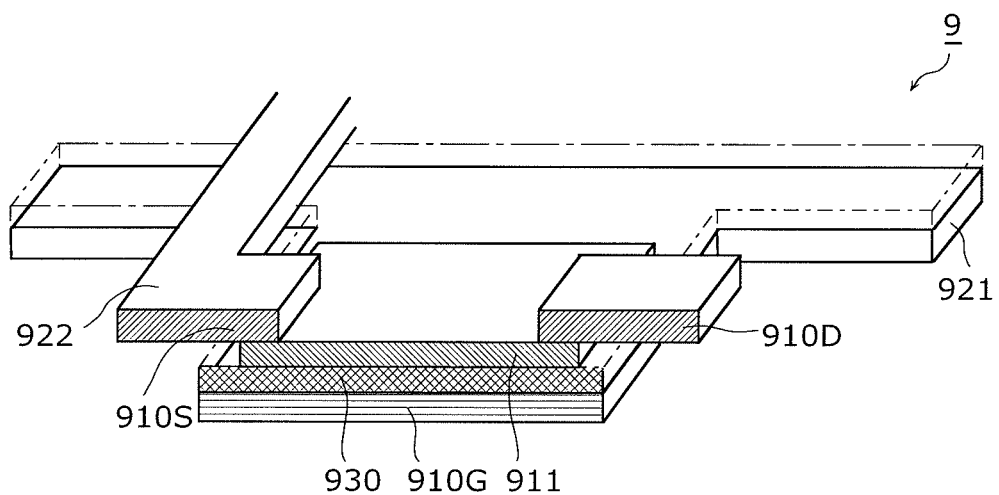
FIG. 23 is a perspective view illustrating major components of the conventional thin-film semiconductor device for display apparatus viewed from a cross-sectional surface along X1-X1' in FIG. 21.

Next, an example of the EL display apparatus to which the EL display panel according to the present disclosure is applied shall be described with reference to FIG. 20. FIG. 20 is an external perspective view illustrating an example of the EL display apparatus according to the present disclosure.

As illustrated in FIG. 20, the EL display apparatus according to the present disclosure is a television set 400 in which the EL display panel according to the present disclosure is embedded.

As such, the EL display panel according to the present disclosure can be used as a flat panel display, for example. Note that, in addition to television sets, the EL display panel according to the present disclosure is applicable to any display apparatus such as mobile phones and personal computers.

The EL display panel, the method for manufacturing the EL display panel, and the EL display apparatus according to the present disclosure have been described based on the embodiments and examples. However, the present disclosure is not limited to the embodiments and examples.

For example, in this embodiment, the first source electrode 310S and the first drain electrode 310D may be switched. More specifically, the configuration is a configuration in which the first source electrode 310S illustrated in FIGS. 3 and 4 is the first drain electrode, and the first drain electrode 310D illustrated in FIGS. 3 and 4 is the first source electrode. Similarly, the second source electrode 320S and the second drain electrode 320D may be switched. More specifically, the configuration is a configuration in which the first source electrode 320S illustrated in FIGS. 3 and 4 is the second drain electrode, and the second drain electrode 320D illustrated in FIGS. 3 and 4 is the second source electrode.

Furthermore, in the embodiments, the first source electrode 310S is part of the line-shaped source line 22. However, it is not limited to this example. For example, when patterning the source line 22, the extended portion extending from part of the source line 22 in row direction is patterned to electrically connect to the first source electrode 310S separately formed.

Furthermore, in the embodiments, one power supply line 23 is arranged between the adjacent gate lines 21. However, it is not limited to this example. For example, multiple power supply lines 23 may be arranged between the adjacent gate lines 21.

Furthermore, in the embodiments, two thin-film transistors are formed for one pixel. However, it is not limited to this example. For example, three or more thin-film transistors may be formed in one pixel. In this case, more than one power supply lines 23 may be arranged to match the number of the thin-film transistors. With this, it is possible to supply desirable power to the thin-film transistors which needs power supply through the power supply lines 23.

Furthermore, in this example, the thin-film semiconductor device for display apparatus according to the present disclosure is applied to the EL display panel. However, it is not limited to this example. For example, the thin-film semiconductor device for display apparatus disclosed here is applicable to a display including other display device such as an inorganic EL panel or a liquid crystal display device, in which an active-matrix substrate is used.

Those skilled in the art will readily appreciate that many modifications are possible in the exemplary embodiments without materially departing from the novel teachings and advantages of the present disclosure. Accordingly, all such modifications are intended to be included within the scope of the present disclosure.

Industrial Applicability

The thin-film semiconductor device for display apparatus and the EL display panel according to the present disclosure is widely applicable to display apparatuses such as television set, personal computer, and mobile phone.

The invention claimed is:

1. A thin-film semiconductor device for a display apparatus, the thin-film semiconductor device comprising:
    a substrate;
    a gate electrode above the substrate;
    a gate insulating film above the substrate to cover the gate electrode;
    a semiconductor layer on the gate insulating film;
    a first electrode above the semiconductor layer;
    a second electrode in a same layer as the first electrode;
    an interlayer insulating film above the gate insulating film to cover the first electrode and the second electrode;
    a gate line above the interlayer insulating film in a layer different from a layer including the gate electrode; and
    a power supply line in a same layer as the gate line and adjacent to the gate line,
    wherein the gate electrode and the gate line are electrically connected via a first conductive portion passing through the gate insulating film and the interlayer insulating film, a longest side of the power supply line extends in parallel with a longest side of the gate line,
    the power supply line and one of the first electrode and the second electrode are electrically connected via a second conductive portion passing through the interlayer insulating film,
    the power supply line supplies power to the first electrode or the second electrode,
    a width of the power supply line corresponds to a width of a gap between two adjacent gate lines, and
    the power supply line is arranged near the two adjacent gate lines to fill the gap between the two adjacent gate lines.

2. The thin-film semiconductor device for a display apparatus according to claim 1,
    wherein a distance from the power supply line to the two adjacent gate lines is greater than or equal to 4 µm.

3. The thin-film semiconductor device for a display apparatus according to claim 1,
    wherein the power supply line has a uniform thickness, and is formed along a shape of a surface of a layer that is under the power supply line.

4. The thin-film semiconductor device for a display apparatus according to claim 1,
    wherein the semiconductor layer is an N-channel semiconductor layer, and
    at least part of the power supply line is arranged not to overlap the semiconductor layer.

5. The thin-film semiconductor device for a display apparatus according to claim 1,
    wherein the semiconductor layer is a P-channel semiconductor layer, and
    at least part of the power supply line is arranged to overlap the semiconductor layer.

6. The thin-film semiconductor device for a display apparatus according to claim 1,
    wherein the first electrode is a source electrode, and the second electrode is a drain electrode.

7. The thin-film semiconductor device for a display apparatus according to claim 1,
    wherein the first electrode is a drain electrode, and the second electrode is a source electrode.

8. The thin-film semiconductor device for a display apparatus according to claim 1,
    wherein the semiconductor layer comprises a polycrystalline semiconductor layer.

9. The thin-film semiconductor device for a display apparatus according to claim 1,
    wherein the power supply line comprises one element selected from among Al, Cu, and Ag.

10. The thin-film semiconductor device for a display apparatus according to claim 9,
    wherein the power supply line is a multilayered line.

11. An electro-luminescence display panel comprising:
    a thin-film semiconductor array device for a display apparatus including a plurality of the thin-film semiconductor devices for display apparatus according to claim 1 each of which is arranged for a pixel;
    a plurality of lower electrodes each of which is arranged above the thin-film semiconductor array device for display apparatus for the pixel;

conductive portions each of which electrically connects the thin-film semiconductor array device for display apparatus and one of the lower electrodes;
a light-emitting layer above the lower electrodes; and
an upper electrode above the light-emitting layer.

12. The electro-luminescence display panel according to claim 11, further comprising
a bank above the thin-film semiconductor array device for display apparatus, the bank having a plurality of openings,
wherein the openings are formed corresponding to the lower electrodes.

13. The electro-luminescence display panel according to claim 11,
wherein the light-emitting layer is an organic light-emitting layer.

14. An electro-luminescence display apparatus comprising:
the electro-luminescence display panel according to claim 11.

15. The thin-film semiconductor device for a display apparatus according to claim 1,
wherein the power supply line linearly extends across a plurality of pixels.

* * * * *